(12) United States Patent
Chew

(10) Patent No.: US 11,538,695 B2
(45) Date of Patent: Dec. 27, 2022

(54) PACKAGING METHOD, PANEL ASSEMBLY, WAFER PACKAGE AND CHIP PACKAGE

(71) Applicant: PEP INNOVATION PTE. LTD., Singapore (SG)

(72) Inventor: Jimmy Chew, Singapore (SG)

(73) Assignee: PEP INNOVATION PTE. LTD., Singapore (SG)

( * ) Notice: Subject to any disclaimer, the term of this patent is extended or adjusted under 35 U.S.C. 154(b) by 0 days.

(21) Appl. No.: 16/703,887

(22) Filed: Dec. 5, 2019

(65) Prior Publication Data
US 2020/0312676 A1    Oct. 1, 2020

(30) Foreign Application Priority Data

Mar. 26, 2019  (SG) .......................... 10201902686R
Apr. 8, 2019  (SG) .......................... 10201903126W
(Continued)

(51) Int. Cl.
*H01L 21/56*   (2006.01)
*H01L 21/02*   (2006.01)
(Continued)

(52) U.S. Cl.
CPC ........ *H01L 21/561* (2013.01); *H01L 21/0201* (2013.01); *H01L 21/568* (2013.01);
(Continued)

(58) Field of Classification Search
None
See application file for complete search history.

(56) References Cited

U.S. PATENT DOCUMENTS

2010/0133680 A1   6/2010 Kang et al.
2011/0065238 A1 * 3/2011 Chiou ..................... H01L 25/50
                                                             438/107
(Continued)

FOREIGN PATENT DOCUMENTS

CN    104362102 A    2/2015
TW    201250961 A    12/2012
(Continued)

*Primary Examiner* — Jay C Chang
(74) *Attorney, Agent, or Firm* — Javalon Law, PC

(57) ABSTRACT

The embodiments of the present disclosure relate to a packaging method, a panel assembly, a wafer package and a chip package. The semiconductor device packaging method includes: providing at least one wafer including a first surface and a second surface opposite to each other and a side surface connecting the first surface and the second surface, the first surface being an active surface; forming a connection portion on the side surface of the at least one wafer around the wafer, the wafer and the connection portion forming a panel assembly, the connection portion includes a third surface on the same side of the first surface of the wafer (Continued)

and a fourth surface on the same side as the second surface of the wafer, the third surface and the first surface forming a to-be-processed surface of the panel assembly; and forming a first dielectric layer on the first surface of the wafer. The packaging method of the embodiments of the present disclosure may improve packaging efficiency and utilization of a wafer.

20 Claims, 34 Drawing Sheets

(30) Foreign Application Priority Data

| | | |
|---|---|---|
| May 10, 2019 | (CN) | 201910390416.1 |
| Jun. 25, 2019 | (SG) | 10201905866P |
| Sep. 2, 2019 | (SG) | 10201908063W |
| Sep. 26, 2019 | (CN) | 201910915139.1 |

(51) Int. Cl.
*H01L 21/78* (2006.01)
*H01L 23/31* (2006.01)
*H01L 23/528* (2006.01)
*H01L 23/00* (2006.01)

(52) U.S. Cl.
CPC .......... *H01L 21/78* (2013.01); *H01L 23/3114* (2013.01); *H01L 23/3121* (2013.01); *H01L 23/528* (2013.01); *H01L 24/94* (2013.01)

(56) References Cited

U.S. PATENT DOCUMENTS

| | | | |
|---|---|---|---|
| 2015/0008566 A1* | 1/2015 | Gerber | H01L 24/19 |
| | | | 257/668 |
| 2015/0318262 A1 | 11/2015 | Gu et al. | |
| 2016/0005628 A1* | 1/2016 | Yap | H01L 23/49827 |
| | | | 257/774 |
| 2017/0372981 A1 | 12/2017 | Su et al. | |
| 2021/0013026 A1* | 1/2021 | Jin | H01L 21/02013 |

FOREIGN PATENT DOCUMENTS

| | | |
|---|---|---|
| TW | 201448139 A | 12/2014 |
| TW | 201608636 A | 3/2016 |
| TW | I648839 B | 1/2019 |
| TW | 201909348 | 3/2019 |
| TW | M597977 | 7/2020 |
| WO | 2019044512 A1 | 3/2019 |

* cited by examiner

PACKAGING METHOD, PANEL ASSEMBLY, WAFER PACKAGE AND CHIP PACKAGE

FIELD OF THE INVENTION

The present disclosure generally relates to a semiconductor device packaging method, a panel assembly, a wafer package and a semiconductor chip package.

BACKGROUND

In recent years, with decreasing size and weight of electronic devices and increasing demand for information processing, chips with small size, lightweight and high speed have become mainstream demands in the market. Due to the small size and thickness of the Chip Scale Package (CSP), the heat generated by the chip may be transmitted to the environment through a short channel. In addition, CSP also offers advantages such as long-term reliability, low line impedance and fast speed. CSP has become the most advanced form of integrated circuit packaging. Therefore, CSP packaged chips have been rapidly adopted in electronic devices.

Wafer level CSP involves forming a conductive layer on a single wafer active surface through processes such as optical contact, photolithography, development, sputtering, electroplating and stripping. A dielectric layer is formed on the conductive layer, and after the conductive layer and the dielectric layer are formed on the wafer, the wafer is singulated into single chips to complete the packaging.

SUMMARY

At least one embodiment in the present disclosure relates to a method for packaging a semiconductor device including: providing at least one wafer including a first surface and a second surface opposite to each other and a side surface connecting the first surface and the second surface, the first surface being an active surface; forming a connection portion on the side surface of the at least one wafer surrounding the wafer, forming a panel assembly with the wafer and the connection portion, the connection portion including a third surface on the same side of the first surface of the wafer and a fourth surface on the same side as the second surface of the wafer, the third surface and the first surface forming a to-be-processed surface of the panel assembly; and forming a first dielectric layer on the first surface of the wafer.

According to one embodiment of the present disclosure, the method for packaging the semiconductor device includes: a step of forming the first dielectric layer on the first surface of the wafer before forming the connection portion.

According to one embodiment of the present disclosure, the method for packaging the semiconductor device includes: a step of forming the first dielectric layer on the to-be-processed surface of the panel assembly after forming the connection portion.

According to one embodiment of the present disclosure, the method for packaging the semiconductor device further includes: a step of forming a conductive layer on the to-be-processed surface of the panel assembly to at least cover the first surface of the wafer, after forming the first dielectric layer on the first surface of the wafer.

According to one embodiment of the present disclosure, the method for packaging the semiconductor device further includes: a step of forming vias in the first dielectric layer to expose die pads on the first surface of the wafer before forming the conductive layer.

According to one embodiment of the present disclosure, the method for packaging the semiconductor device includes: a step of providing a plurality of wafers, the plurality of wafers being separated from each other in the panel assembly.

According to one embodiment of the present disclosure, forming the conductive layer on the to-be-processed surface of the panel assembly to cover at least the first surface of the wafer includes: forming an active conductive layer on the first surface of the wafer and forming a dummy conductive layer on the third surface of the connection portion.

According to one embodiment of the present disclosure, the dummy conductive layer is formed at least in an annular area surrounding the wafer, and the annular area has a width greater than 5 mm.

According to one embodiment of the present disclosure, the conductive layer is formed using an electroplating process.

According to one embodiment of the present disclosure, forming the connection portion includes: forming a conductive member, the conductive member being exposed in the third surface of the connection portion, located in a peripheral area of the panel assembly and spaced apart from the wafer.

According to one embodiment of the present disclosure, forming the connection portion includes: disposing the wafer over a carrier, the first surface of the wafer facing the carrier; forming an encapsulation layer over the carrier and the wafer, so that the encapsulation layer covers the side surface and the second surface of the wafer; and separating the carrier to expose the to-be-processed surface of the panel assembly.

According to one embodiment of the present disclosure, forming the connection portion includes: disposing the wafer over a carrier, the second surface of the wafer facing the carrier, disposing a cavity mold with a through opening on the carrier, so that the wafer is positioned within the opening, forming a fixing material in a gap between a sidewall of the opening and the side surface of the wafer to connect the wafer to the cavity mold.

According to one embodiment of the present disclosure, forming the connection portion includes: disposing the wafer over a carrier, the first surface facing the carrier, disposing a cavity mold having a through opening on the carrier, so that the wafer is positioned within the opening, forming a fixing material in a gap between a sidewall of the opening and the side surface of the wafer to connect the wafer to the cavity mold; and separating the carrier to expose the to-be-processed surface of the panel assembly.

According to one embodiment of the present disclosure, a material of the cavity mold includes a conductive material.

According to one embodiment of the present disclosure, the method for packaging the semiconductor device further includes: forming a second dielectric layer on the side surface of the conductive layer remote from the panel assembly to cover at least part of the conductive layer.

According to one embodiment of the present disclosure, the method for packaging the semiconductor device further includes: forming a functional layer on the to-be-processed surface of the panel assembly after forming the first dielectric layer on the first surface of the wafer.

At least one embodiment in the present disclosure relates to a panel assembly, which includes: at least one wafer including a first surface and a second surface opposite to each other and a side surface connecting the first surface and the second surface, the first surface being an active surface, a connection portion disposed on the side surface of the wafer and connected to the wafer, the connection portion including a third surface on the same side of the first surface of the wafer and a fourth surface on the same side as the second surface of the wafer, the third surface and the first surface forming a to-be-processed surface of the panel assembly; and a first dielectric layer disposed at least on the first surface of the wafer.

According to one embodiment of the present disclosure, a surface of the first dielectric layer is substantially coplanar with the third surface of the connection portion.

According to one embodiment of the present disclosure, the third surface of the connection portion is substantially coplanar with the first surface of the wafer, and the first dielectric layer is on the to-be-processed surface of the panel assembly.

According to one embodiment of the present disclosure, the panel assembly includes: a plurality of wafers disposed apart from each other.

According to one embodiment of the present disclosure, the panel assembly further includes: a conductive layer disposed on the to-be-processed surface and on a side of the first dielectric layer remote from the wafer.

According to one embodiment of the present disclosure, the first dielectric layer includes vias to expose die pads on the first surface of the wafer.

According to one embodiment of the present disclosure, the conductive layer includes an active conductive layer on the first surface of the wafer and a dummy conductive layer on the third surface of the connection portion.

According to one embodiment of the present disclosure, the dummy conductive layer is formed at least in an annular area surrounding the wafer, and the annular area has a width greater than 5 mm.

According to one embodiment of the present disclosure, the panel assembly further includes: a conductive member exposed in the third surface of the connection portion, located in a peripheral area of the panel assembly and spaced apart from the wafer.

According to one embodiment of the present disclosure, the connection portion includes a first part on the side surface of the wafer and a second part on the second surface of the wafer, the first part and the second part being integrally connected.

According to one embodiment of the present disclosure, the connection portion includes an encapsulation layer.

According to one embodiment of the present disclosure, the connection portion includes a cavity mold with a through opening, the wafer is positioned within the opening, and a fixing material is disposed in a gap between the sidewall of the opening and the side surface of the wafer to connect the wafer to the cavity mold.

According to one embodiment of the present disclosure, a material of the cavity mold includes a conductive material.

According to one embodiment of the present disclosure, the panel assembly further includes: a second dielectric layer on a side of the conductive layer remote from the wafer and covering at least part of the conductive layer.

According to one embodiment of the present disclosure, the second part of the connection portion on the second surface of the wafer has a predetermined material and thickness to slow down or eliminate warpage of the panel assembly.

At least one embodiment in the present disclosure relates to a wafer package, which includes: a wafer including a first surface and a second surface opposite to each other and a side surface connecting the first surface and the second surface, the first surface being an active surface; an encapsulation layer on at least one of the side surface and the second surface of the wafer; and a dielectric layer on the first surface of the wafer.

According to one embodiment of the present disclosure, the wafer package further includes: a conductive layer on a side of the first dielectric layer remote from the wafer.

According to one embodiment of the present disclosure, the wafer package further includes: a second dielectric layer on a side of the conductive layer remote from the wafer to cover at least part of the conductive layer.

According to one embodiment of the present disclosure, the encapsulation layer includes a part on the second surface of the wafer, and the part of the encapsulation layer on the second surface of the wafer has a predetermined material and thickness to slow down or eliminate warpage of the wafer package.

At least one embodiment in the present disclosure relates to a semiconductor chip package, which includes: a die including a first surface and a second surface opposite to each other and a side surface connecting the first and the second surface, the first surface being an active surface; an encapsulation layer on the second surface of the die; and a dielectric layer on the first surface of the wafer.

According to one embodiment of the present disclosure, the semiconductor chip package further includes: a conductive layer on a side of the first dielectric layer remote from the die.

According to one embodiment of the present disclosure, the first dielectric layer includes vias to expose die pads on the first surface of the die.

According to one embodiment of the present disclosure, the semiconductor chip package further includes: a second dielectric layer on a side of the conductive layer remote from the die to cover at least part of the conductive layer.

According to one embodiment of the present disclosure, the encapsulation layer has a predetermined material and thickness to slow down or eliminate warpage of said semiconductor chip package.

According to the semiconductor device packaging method, panel assembly, wafer package and semiconductor chip package of the present disclosure, clamping a part of the wafer in the packaging process may be avoided by forming a panel assembly, thereby avoiding the formation of an ineffective area on the wafer. In addition, a dummy conductive layer may be formed in the periphery of the wafer of the panel assembly, thereby avoiding formation of an ineffective area of the wafer due to uneven edge properties of a conductive layer. Since multiple wafers may be integrated on the panel assembly, multiple wafers may be processed simultaneously, which greatly improves packaging efficiency.

BRIEF DESCRIPTION OF THE DRAWINGS

In order to clearly illustrate various embodiments of the present invention, the drawings of the embodiments will be briefly described below. It is obvious that the drawings in the following description relate only to some embodiments of the present invention, and are not intended to limit the present invention.

DETAILED DESCRIPTION

Figure 1A:
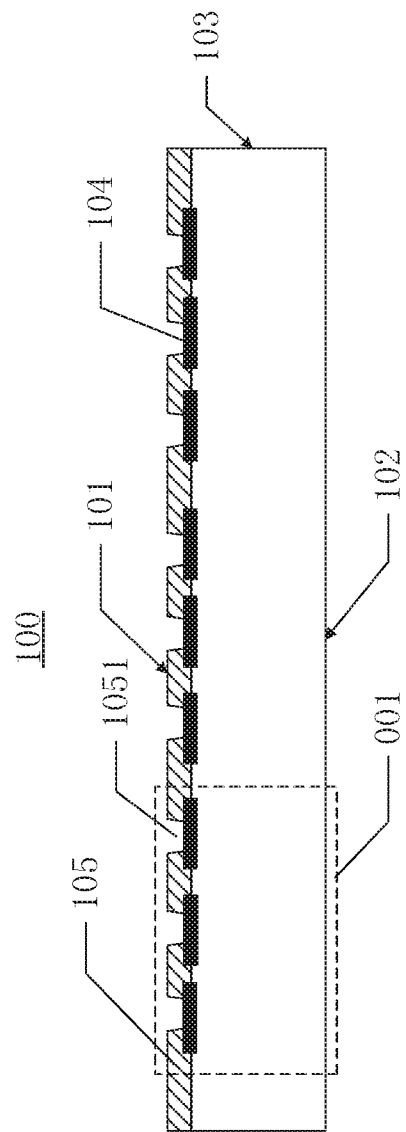
FIG. 1A is a schematic cross-sectional view of a semiconductor wafer used in a semiconductor device packaging method in one embodiment of the present disclosure.

Various embodiments of the present invention will be clearly described with reference to the accompanying drawings, in order to better present the purpose, technical solutions and advantages of the embodiments. It is apparent that the embodiments described herein are part of the embodiments of the invention, and not all of the embodiments. All other embodiments obtained by a person of ordinary skill in the art based on the described embodiments of the present invention without creative work are within the scope of the invention.

Unless otherwise defined, technical terms or scientific terms used in the present disclosure are intended to be understood in the ordinary meaning of the ordinary skill of the art. The words "first", "second" and similar terms used in the present disclosure do not denote any order, quantity or importance, but are used to distinguish different components. The word "comprising" or "including" or the like are intended to mean that the element or item that precedes the word includes the element or the item that is recited after the word and its equivalent, and does not exclude other elements or items. In addition, the singular terms "a", "an", and "the" include plural references unless context clearly indicates otherwise. Similarly, the word "or" is intended to include "and" unless the context clearly indicates otherwise.

In the wafer level CSP process of the related art, since a single wafer is used for each process step, the package production efficiency of the chip is low, and the package cost is high. On the other hand, during formation of a conductive layer of a wafer level CSP, a conductive jig of the conductive layer forming device is required to clamp the periphery of the wafer, and then immerse the wafer in the treatment liquid of a processing tank of the conductive layer forming device to form a conductive layer. However, this process requires an area in the periphery of the wafer for the conductive jig to clamp the wafer, the area includes the electrical connection area corresponding to the electrical connection contact point and the sealing area corresponding to the seal. Therefore, an area of at least 3 mm in the periphery of the wafer is an ineffective area, that is, the peripheral area of the wafer cannot be used for packaging and production of chips. Due to the high price of the wafer, the presence of this ineffective area has greatly increased the price of the package. On the other hand, since the current density during the formation of the conductive layer is unevenly distributed on the surface of the wafer, the conductive layer formed in the peripheral area of the wafer is thicker, and the conductive layer formed in the inner area is thinner. Consequently, the parameters of packaged products from the same batch are inconsistent. The above three deficiencies limit the application of the wafer level CSP.

Embodiments of the present disclosure relate to a packaging method of a semiconductor device. In the packaging method, a connection portion is formed in the periphery of at least one wafer to form a panel assembly. The connection portion of the panel assembly, the surface on the same side of the active surface of the wafer and the active surface of the wafer form a to-be-processed surface. The packaging process is performed on the to-be-processed surface of the panel assembly so that the clamping region can be placed on the connection member around the wafer to prevent the peripheral area of the wafer from forming an ineffective area. Further, it is also possible to expand the area where the conductive layer is formed to a partial area on the connection portion around the wafer so that the properties of the conductive layer formed on the wafer are uniform. In addition, in the case where the panel assembly includes a plurality of wafers, the plurality of wafers can be packaged at the same time, thereby greatly improving packaging efficiency. Further technical effects of the present disclosure will be described in details in conjunction with the following embodiments.

Figure 1B:
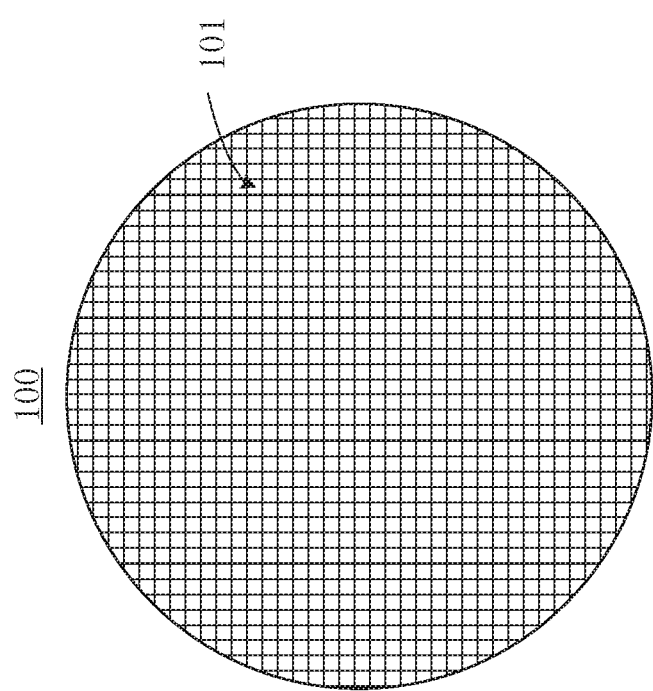
FIG. 1B is a schematic plan view of the structure of a semiconductor wafer shown in FIG. 1A.

FIG. 1A shows a schematic cross-sectional view of a semiconductor wafer used in a semiconductor device packaging method of an embodiment. FIG. 1B shows a schematic plan view of the structure of the semiconductor wafer. A semiconductor wafer is a semiconductor device structure formed after the formation of a circuit structure on a semiconductor substrate through a semiconductor process, which is also referred to as a wafer. The present disclosure is not particularly limited to the type, size, and the like of the semiconductor wafer. For example, as shown in FIG. 1A, the semiconductor wafer 100 includes an active surface 101 and a back surface 102 opposite to each other. In addition, the wafer 100 further includes a side surface 103 that connects the active surface 101 and the back surface 102. Wafer 100 may include a plurality of areas for forming dies. For example, an area 001 for forming a die is schematically illustrated in FIG. 1A with a dashed box. For example, a plurality of dies may be formed after the wafers are diced in accordance with circuit functional units or other ways. The active surfaces of all the areas 001 for forming the dies collectively constitute the active surface 101 of the wafer 100. The active surface of each of the areas used to form the die may include a series of active and passive components thereon which are formed by a series of semiconductor processes such as doping, deposition, etching, and the like. The active components may include, for example, diodes and transistors. The passive components may include, for example, transformers, capacitors, resistors, inductors. These active components and passive components are connected by connecting wires to form a functional circuit, thereby realizing various functions of the chip. The active surface 101 also includes die pads 104 leading to the functional circuit and an insulating protective layer 105 for protecting the die pads 104. For example, the insulating protective layer 105 may be formed from an inorganic insulating material, which includes but not limited to silicon oxide, silicon nitride and silicon oxynitride. For example, the insulating protective layer 105 includes vias 1051 corresponding to the locations of the die pads 104 to expose the corresponding die pads 104, thereby enabling the die pads 104 to be electrically connected to external components.

Figure 2A:
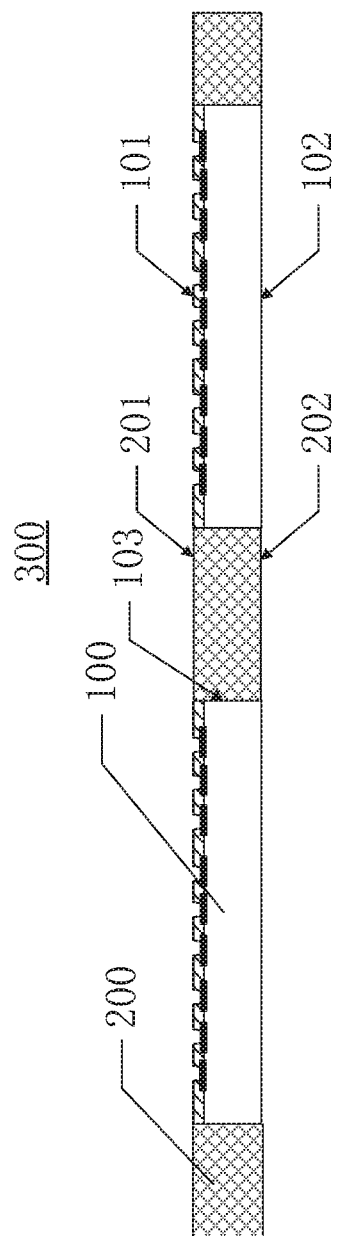
FIG. 2A is a schematic cross-sectional view of the structure of a panel assembly formed by a semiconductor packaging method in one embodiment of the present disclosure.

In the semiconductor device packaging method of an embodiment of the present disclosure, as shown in FIG. 2A, the connection portion 200 around the wafer 100 is formed on the side surface 103 of the semiconductor wafer 100 so that a panel assembly 300 is formed by the wafer 100 and the connection portion 200. For example, the connection portion 200 includes a front surface 201 on the same side as the active surface 101 of the wafer 100 and a rear surface 202 on the same side as the back surface 102 of the wafer 100. As shown in FIG. 2A, after the wafers 100 are connected into a panel assembly 300 through the connection portion 200, a process (e.g., a packaging process) may be performed on a to-be-processed surface which is formed by the front surface 201 of the connection portion 200 and the active surface 101 of the wafer 100 in order to form a functional layer on the to-be-processed surface. For example, the functional layer may include all or a portion of the conductive layer and dielectric layer formed on the to-be-processed surface of the panel assembly as described in the following embodiments. During the process, at least a portion of the connection portion can be clamped, thereby avoiding direct clamping of the wafer 100 to form an ineffective area. In addition, various functional layers formed on the to-be-processed surface may be simultaneously formed on the wafer and at least a portion of the area on the connection portion around the wafer. This avoids peripheral portions of the various functional layers from being formed on the wafer. Formation of the peripheral portions of the various functional layers on the wafer can result in the introduction of ineffective regions on the packaged wafer. For example, the peripheral portions of the various functional layers may have properties (such as thickness) that do not meet the desired requirements.

As shown in FIG. 2A, in some embodiments, the front surface 201 of the connection portion 200 is substantially coplanar with the active surface 101 of the wafer 100, that is, the front surface 201 of the connection portion 200 is substantially flush with the active surface 101 of the wafer 100. Under such circumstances, it may be advantageous to form various functional layers on the to-be-processed surface of the panel assembly.

In some embodiments, as shown in FIG. 2A, the connection portion 200 is formed only on the side surface 103 of the semiconductor wafer 100, that is, it is formed only around the semiconductor wafer 100. However, embodiments of the present disclosure are not limited thereto, and the connection portion 200 may be further formed on the back surface 102 of the semiconductor wafer 100. This will be described in detail in further embodiments.

Figure 2B:
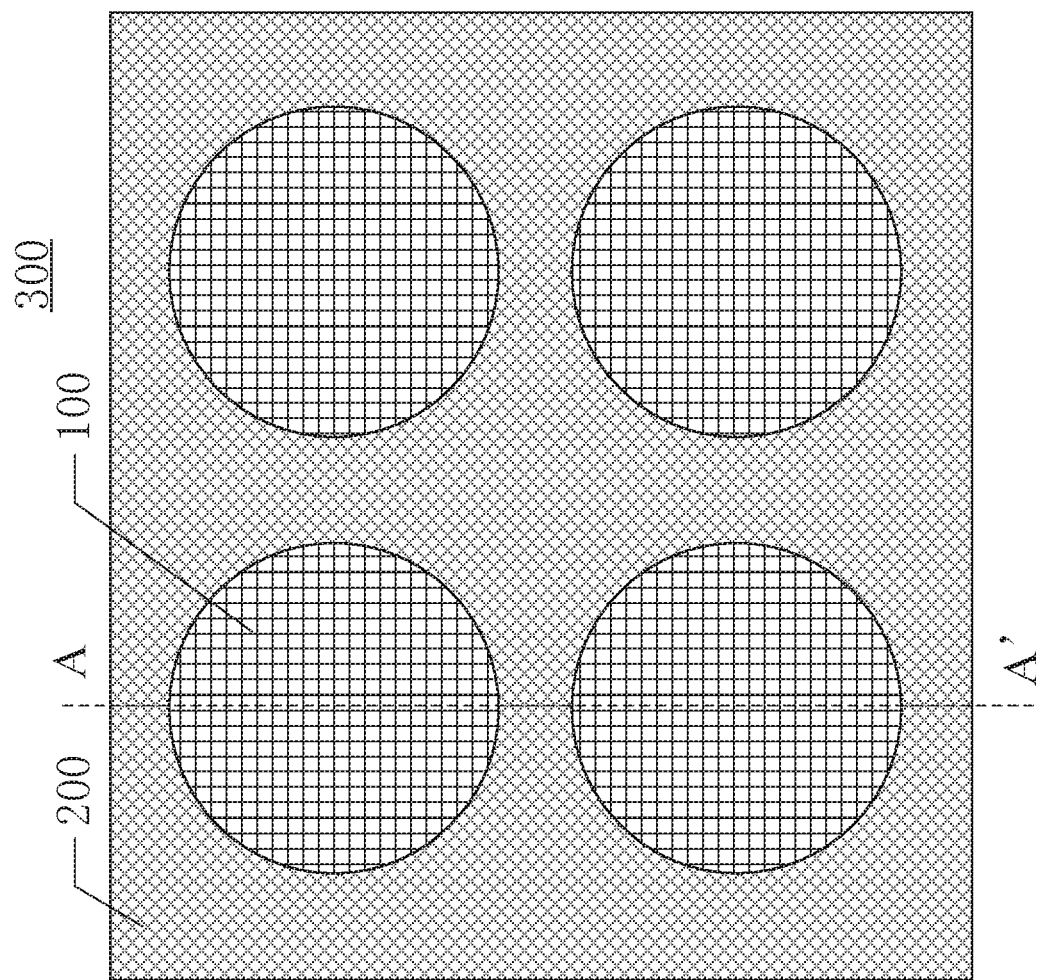
FIG. 2B is a schematic plan view of the structure of a panel assembly formed by a semiconductor packaging method in one embodiment of the present disclosure.

FIG. 2B shows a schematic plan view of the cross-sectional structure of FIG. 2A. Specifically, FIG. 2A corresponds to the cross-sectional structure taken at line AA' of FIG. 2B. As shown in FIG. 2B, the formed panel assembly 300 includes four semiconductor wafers 100. However, the number of semiconductor wafers of an embodiment of the present disclosure is not particularly limited. Panel assembly 300 may also include only one semiconductor wafer 100. Under such circumstances, the above-mentioned clamping area may also fall on the connection portion instead of directly on the wafer, and the functional layers may be formed on at least part of the area on the connection portion around the wafer. In addition, the panel assembly 100 may also include more than two semiconductor wafers, for example, it may include two, four or eight semiconductor wafers. In the case where the panel assembly includes more than two semiconductor wafers, more than two semiconductor wafers can be processed simultaneously (for example, undergoing a packaging process simultaneously), so that the packaging efficiency of the semiconductor wafer may be greatly improved.

As shown in FIG. 2B, a plurality of wafers 100 in the panel assembly can be separated from each other so that a space can be left at the periphery of each wafer to form various functional layers. The size of the interval between the wafers is not particularly limited in the embodiments of the present disclosure and may be adjusted according to actual conditions.

The planar shape of the panel assembly shown in FIG. 2B is substantially rectangular. However, embodiments of the present disclosure are not limited thereto. The planar shape of the panel assembly can be arbitrarily adjusted according to factors such as the number and arrangement of the integrated semiconductor wafers, and the equipment used to perform the plating process, etc.

The semiconductor package device packaging method in accordance with an embodiment of the present disclosure may further include forming a conductive layer on the to-be-processed surface of the panel assembly to cover at least the active surface of the wafer after the panel assembly is formed. For example, the conductive layer may be electrically connected to the die pads on the wafer through vias in the insulating protective layer on the wafer. For example, the conductive layer may include conductive traces and conductive pillars. After the conductive layer is formed, a dielectric layer may also be formed on the conductive layer. The dielectric layer may be used to protect the conductive layer and insulate different conductive traces and conductive pillars. The formation of the conductive layer and the dielectric layer will be described in more detail later. In addition, the combined structure formed of the conductive layer and the dielectric layer may be repeatedly stacked on the wafer, which is not particularly limited in the embodiments of the present disclosure.

Figure 3A:
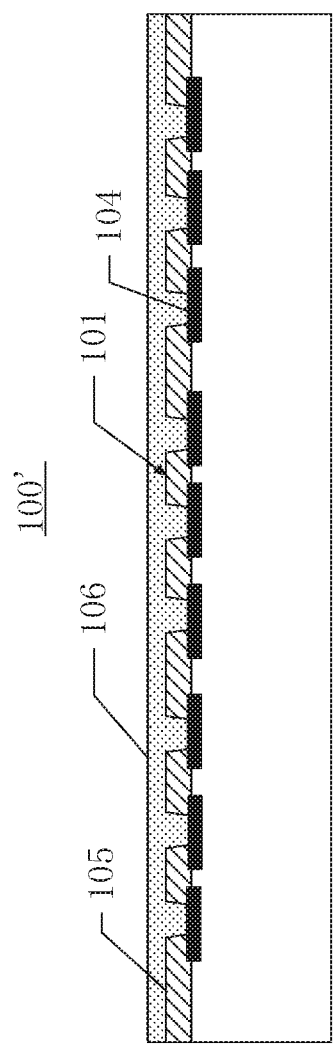
FIG. 3A is a schematic cross-sectional view of the structure of a dielectric layer formed on a wafer in a semiconductor packaging method in one embodiment of the present disclosure.
Figure 3B:
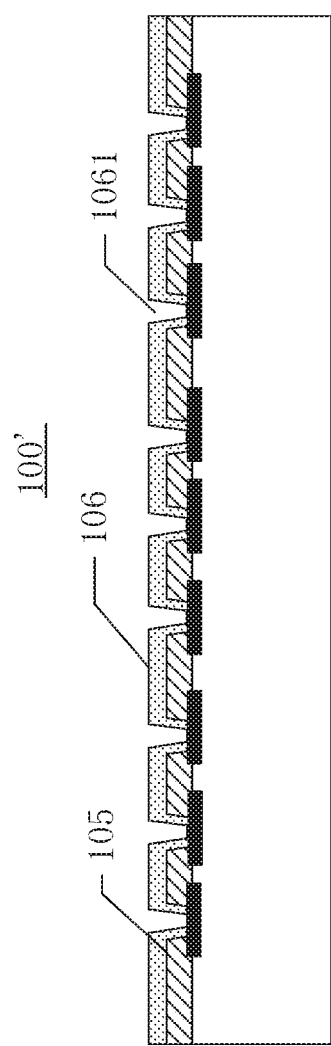
FIG. 3B is another schematic cross-sectional view of the structure of a dielectric layer formed on a wafer in a semiconductor packaging method in one embodiment of the present disclosure.
Figure 3C:
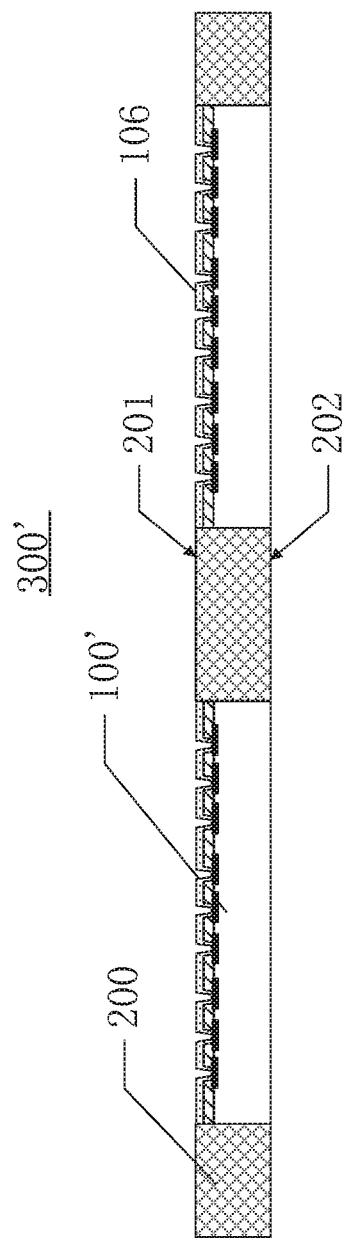
FIG. 3C is a schematic cross-sectional view of a panel assembly formed by connecting wafers having dielectric layers in a semiconductor packaging method in one embodiment of the present disclosure.

According to some embodiments of the present disclosure, as shown in FIGS. 3A and 3B, a dielectric layer 106 is formed on the active surface 101 of the wafer 100 prior to the formation of the connection portion. The dielectric layer 106 may be used to protect the active surface 101 of the wafer. In addition, as shown in FIG. 3B, for the wafer 100' including the dielectric layer 106, the packaging process may further include forming vias 1061 in the dielectric layer 106 to expose the die pads 104 on the active surface of the wafer. Thereby, the conductive layer may be electrically connected to the die pads in the packaging process. The step of forming the vias 1061 in the dielectric layer 106 of the wafer 100' may be performed, for example, before or after the wafers are connected into a panel assembly, and the embodiments of the present disclosure are not particularly limited thereto. For example, after the dielectric layer 106 is formed on the active surface 101 of the wafer 100 to form the wafer 100', the wafer 100' may be subjected to the same packaging process steps as the wafer 100, and details are not repeated herein. For example, FIG. 3C shows a structural schematic view of the panel assembly formed by the wafers 100' after the connection portions are formed. In such structure, for example, the front surface 201 of the connection portion 200 may be substantially coplanar with the surface of the dielectric layer 106, that is, the front surface 201 of the connection portion 200 may be substantially flush with the surface of the dielectric layer 106.

Figure 4A:
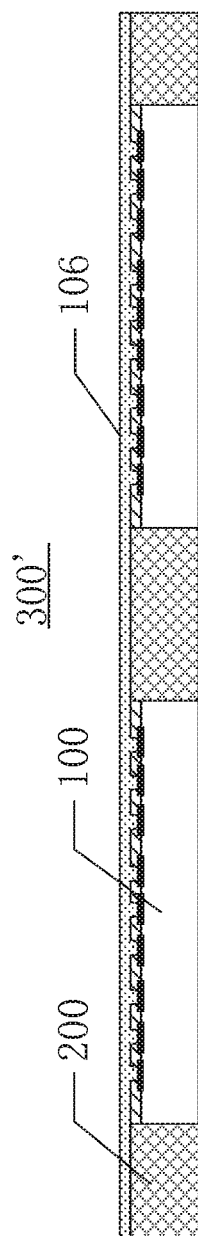
FIG. 4A is a schematic cross-sectional view of a dielectric layer formed on a panel assembly before a conductive layer is formed in a semiconductor packaging method in one embodiment of the present disclosure.

In other embodiments of the present disclosure, a dielectric layer may be formed after the wafers 100 are connected to form the panel assembly 300. That is, after the panel assembly 300 shown in FIG. 2A is formed, a dielectric layer 106 is formed on the to-be-processed surface of the panel assembly 300 to form the panel assembly 300'. As shown in FIG. 4A, a dielectric layer 106 is formed over the entire to-be-processed surface of the panel assembly 300'. However, embodiments of the present disclosure are not limited thereto, and the dielectric layer 106 may cover only the active surface 101 of the wafer 100. In the case where the dielectric layer 106 is formed over the entire to-be-processed surface of the panel assembly 300', the portion of the connection portion corresponding to the electrical contact point for the plating process can also be removed to enable power supply access in the plating process, which will be described in a more detailed embodiment later. Additionally, in some examples, the dielectric layer 106 may be formed only in the middle region of the panel assembly where the wafer 100 is disposed (e.g., which may also include areas between adjacent wafers) without covering the periphery area of the panel assembly, thereby exposing the electrical contacts in the peripheral area of the panel assembly.

Figure 4B:
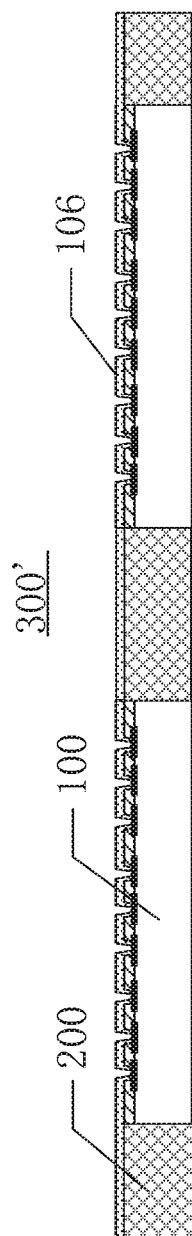
FIG. 4B is another schematic cross-sectional structural view of a dielectric layer formed on a panel assembly before a conductive layer is formed in a semiconductor packaging method in one embodiment of the present disclosure.

For example, regardless of the embodiment in FIG. 3A or FIG. 3B or the embodiments in FIGS. 4A and 4B, the dielectric layer 106 may be formed by the following materials and processes. It should be noted that the dielectric layer materials and processes herein are merely exemplary, and the dielectric layer 106 in the embodiments of the present disclosure may also be formed by using any other suitable materials or processes. For example, the dielectric layer 106 may be formed from an organic insulating material. In some embodiments, the dielectric layer 106 may be formed from any one or more of polyimide, epoxy resin, ABF (Ajinomoto Buildup Film) and polybenzoxazole (PBO). In some embodiments, the ABF is formed on the active surface of the wafer or on the to-be-processed surface of the panel assembly, and then vias are formed in the ABF by a laser puncturing process to expose the die pads on the wafer. In some other embodiments, a polyimide or polybenzoxazole film is first formed on the active surface of the wafer or on the to-be-processed surface of the panel assembly, and then vias are formed in the polyimide or polybenzoxazole film by a lithography patterning process or a laser puncturing process to expose the die pads on the wafer. In addition, in some embodiments, an adhesion promoter may be formed on the active surface of the wafer or the to-be-processed surface of the panel assembly before the formation of the dielectric layer 106 to facilitate the adhesion of the dielectric layer 106 and the wafer surface. For example, the material of the dielectric layer 106 may be formed on a semiconductor wafer by lamination, coating and printing, etc.

According to the semiconductor device packaging method of some embodiments of the present disclosure, the step of forming the connection portion may further include forming a conductive member. For example, the conductive member and the wafer are spaced apart from each other and exposed on the front surface of the connection portion. For example, the formed conductive members are in a peripheral area of the panel assembly.

Figure 5A:
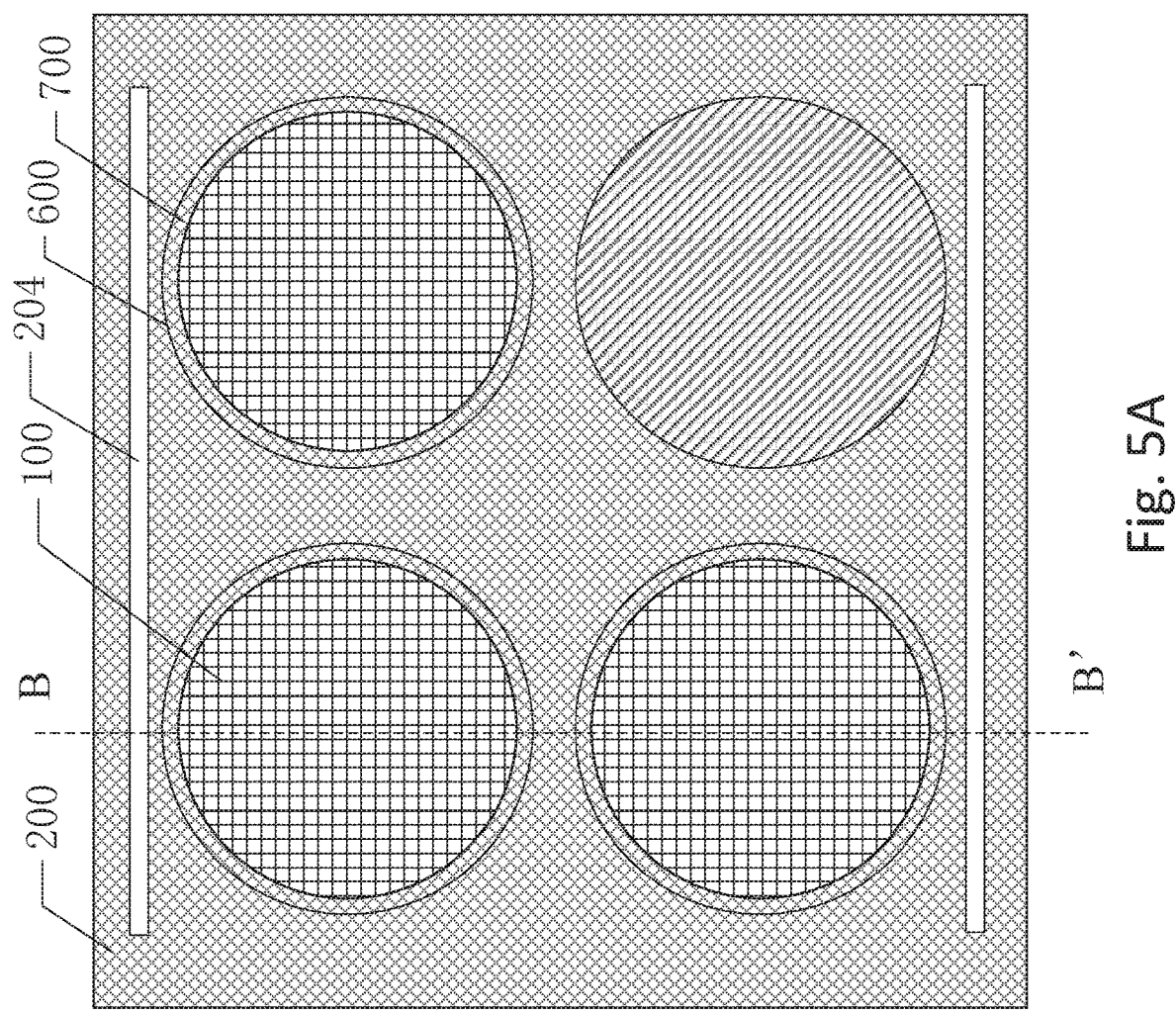
FIG. 5A is a schematic plan view of a structure in which conductive members are formed in a connection portion and a conductive layer is formed on a to-be-processed surface of a panel assembly in a semiconductor device packaging method in one embodiment of the present disclosure.
Figure 5B:
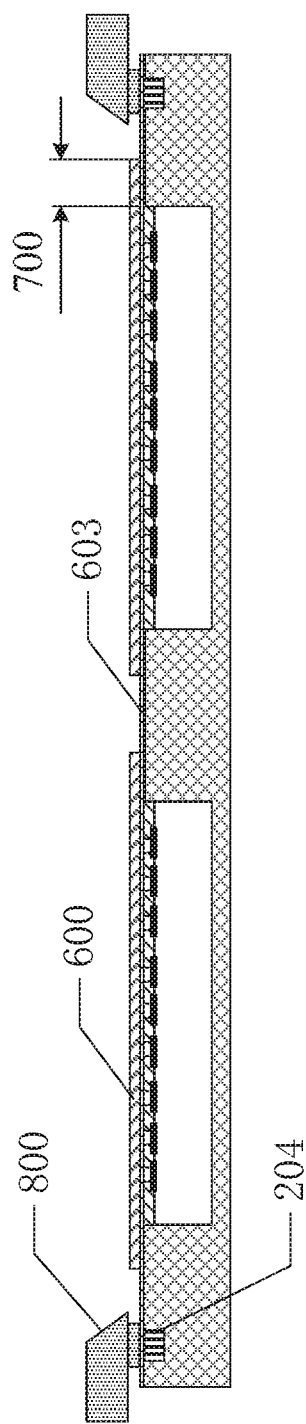
FIG. 5B is a schematic cross-sectional view of a structure in which conductive members are formed in a connection portion and a conductive layer is formed on a to-be-processed surface of a panel assembly in a semiconductor device packaging method in one embodiment of the present disclosure.

FIGS. 5A and 5B are schematic views of forming conductive members in a connection portion and forming a conductive layer on a to-be-processed surface of a panel assembly in a semiconductor device packaging method in some embodiments of the present disclosure. FIG. 5B is a cross-sectional view along line BB' in FIG. 5A (in addition, FIG. 5B additionally shows a plating contact electrode 800 for an electroplating process). The connection portion shown in FIGS. 5A and 5B includes a portion formed on the side surface of the wafer and also a portion formed on the back surface of the wafer. However, the structure of the connection portion in FIGS. 5A and 5B is exemplary, and the processes for forming the conductive member and forming the conductive layer in the embodiments illustrated in FIGS. 5A and 5B are also applicable to the panel assembly in FIGS. 2A, 3C and 4B.

As shown in FIGS. 5A and 5B, the steps of forming the connection portion include forming the conductive members 204. For example, the conductive members 204 and the wafer 100 are spaced apart from each other. For example, the conductive member 204 may be formed in a peripheral area of the wafer, that is, a peripheral area of the panel assembly. As shown in FIG. 5A, in some embodiments, conductive members 204 are formed in the peripheral areas of the upper and lower portions of the panel assembly, respectively. However, the embodiments of the present disclosure are not limited thereto, and the conductive member 204 may also be formed in a left peripheral area of the panel assembly or a right peripheral area of the panel assembly. Alternatively, the conductive members formed on the different sides may also be connected to each other. For example, the conductive member may be formed in a rectangular frame shape surrounding the peripheral area of the wafer. As shown in FIG. 5B, the conductive member 204 is exposed in the front surface 201 of the connection portion. The conductive members 204 may be used for electrical contacts in subsequent plating processes of the conductive layer formation and, therefore, may be exposed in the front surface of the panel assembly to facilitate electrical connection. For the panel assembly structure shown in FIG. 4B, a portion of the dielectric layer 106 formed on the front surface of the panel assembly may be removed to expose the conductive member 204. Alternatively, the dielectric layer 106 may be formed only in the middle region of the panel assembly where the wafer is disposed, thereby exposing the conductive member 204. In the embodiment shown in FIG. 5B, the conductive member 204 is substantially flush with the other part of the connection portion. For example, on the side of the to-be-processed surface of the panel, when the electroplating process is performed, the conductive member 204, the connection portion on the inner side of the conductive member 204 and the wafer are substantially coplanar, thereby facilitating the formation of the conductive layer through the electroplating process. Further, although not shown in the drawings, for example, in the peripheral area of the outer side of the conductive member, the connection portion of the panel assembly may include a concave-convex structure for mechanically engaging with a device of a plating process.

For example, according to the semiconductor device packaging method of the embodiment of the present disclosure, the conductive layer may be formed by an electroplating process. The steps of forming a conductive layer in some embodiments of the present disclosure are described below in conjunction with FIG. 5B. As shown in FIG. 5B, a seed layer 603 is formed on the to-be-processed surface of the panel assembly. For example, the seed layer 603 is a metal layer formed by a sputtering process. For example, the seed layer 603 may be formed over the entire to-be-processed surface and electrically connected with the conductive members 204. Thereby, a current may be transmitted via the conductive members 204 as the electrical contact points to perform the plating process during the formation of the conductive layer. For example, the seed layer 603 may be formed on the to-be-processed surface of the panel assembly by sputtering or electroless plating. For example, the seed layer may be a copper layer and is very thin, for example, in the range below 100 nm. After the seed layer 603 is formed, the conductive layer 600 may be formed by an electroplating process. Since the thickness of the seed layer 603 is small, the contact force with the plated contact electrode 800 may cause the seed layer at the contact position to wear, resulting in poor conductive contact between the panel assembly and the plated contact electrode 800 and affecting the pattern quality of the conductive layer. However, due to the conductivity of the conductive members 204, the presence of the conductive members 204 allows a portion of the seed layer to be in contact with the plating contact electrode, so as to maintain good contact between the panel assembly and the plating contact electrode 800 even in the case of wear and tear. At the same time, the conductive members enhance the electrical conductivity of the panel assembly and conducts currents well. The current input by the conductive members flows uniformly over the to-be-processed surface of the entire panel assembly.

As shown in FIG. 5B, the plating contact electrodes 800 of the plating apparatus are electrically connected to the conductive members 204 on the panel assembly. As described above, before the formation of the conductive layer 600, the seed layer 603 may be formed on the to-be-processed surface of the panel assembly, so that the plating contact electrodes 800 and the conductive members 204 may apply a voltage on the seed layer 603, so as to form a conductive layer on the to-be-processed surface by an electroplating process. In some embodiments, an insulating mask layer (not shown) may be pre-deposited on a portion of the seed layer where the formation of a conductive layer is not required, thereby enabling formation of a conductive layer having a predetermined pattern. As shown in FIGS. 5A and 5B, the conductive layer 600 may be formed in an area larger than the area in which the wafer 100 is located, that is, in addition to forming a conductive layer on the active surface of the wafer, a conductive layer may also be formed in an annular area 700 (which is on the connection portion) around the wafer. The conductive layer on the active surface of the wafer is electrically connected to the circuitry in the wafer to form an effective conductive layer. The conductive layer formed within the annular area 700 is a dummy conductive layer that is not used to form the final packaged chip. The dummy conductive layer in the annular area 700 may push the edge of the conductive layer 600 beyond the area where the wafer is, thereby avoiding the adverse effects caused by issues such as uneven thickness of the edge of the conductive layer 600. Therefore, a uniform conductive layer may be formed on the entire active surface of the wafer, which improves the effective utilization of the wafer.

Although the conductive layer 600 shown in FIG. 5B is shown as a continuous conductive layer structure, this is merely for convenience of the illustration. For example, conductive layer 600 may be a patterned conductive layer, for example, it may include conductive traces and conductive pillars, as will be described in detail in later embodiments. For example, the dummy conductive layer within the annular area 700 and the conductive layer formed on the active surface of the wafer may have a uniform pattern or may be connected to each other. In the process of forming the conductive layer 600 by using the electroplating process, the thickness of the edge of the conductive layer is often uneven or different from the thickness of the central portion of the conductive layer, due to concentration of current. Therefore, the thickness of the edge of the conductive layer is not easily controlled. However, in the central portion of the conductive layer, since the current density is uniform, the thickness of the formed conductive layer is uniform and easy to control. Therefore, by forming a dummy conductive layer in the peripheral area of the wafer, the uneven portion may be formed outside the area where the active surface of the wafer is, so that the thickness of the conductive layer formed on the active surface of the wafer is uniform, thereby avoiding an ineffective area of the wafer from being formed in the packaging process. As described above, for the annular area in which the dummy conductive layer is formed, the width of the annular area may be greater than 5 mm, in order to better prevent the formation of the uneven conductive layer within the active surface of the wafer. For example, the width herein refers to the dimension of the annular area along the radial direction of the wafer.

Although the conductive layer is formed by an electroplating process in the above embodiment, the embodiments of the present disclosure are not limited thereto, and the conductive layer 600 may be formed by other suitable processes. Further, although it has been described in the above embodiment that the unevenness of the edge thickness of the conductive layer is caused by the plating process, the embodiments of the present disclosure are not limited thereto. The problem of the edge defects of the conductive layer brought about by other methods may also be alleviated or avoided through the method of forming the dummy conductive layer described in the above embodiments.

In the structures shown in FIGS. 5A and 5B, examples of the formation of a conductive layer on the active surface of the wafer and the annular area 700 surrounding the wafer are described. However, embodiments of the present disclosure are not limited thereto, and a conductive layer may be formed on the entire or most of the to-be-processed surface of the panel assembly.

Hereinafter, the technical solutions of the present disclosure and corresponding technical effects will be further described in some embodiments of the present disclosure. As may be seen from the above description, the wafers 100 may be used to form the panel assembly 300, or the wafer 100' with the active surface on which the dielectric layer 106 is formed may be used to form a panel assembly, or a dielectric layer may be formed on the to-be-processed surface of the panel assembly 300 prior to a conductive layer formation process. For simplicity of illustration, in the following embodiments, the dielectric layer 106 will not be shown in detail, the steps of forming the dielectric layer 106 on the wafer 100 or forming the dielectric layer 106 on the to-be-processed surface of the panel assembly may be applicable to the embodiments described below.

Figure 6A:
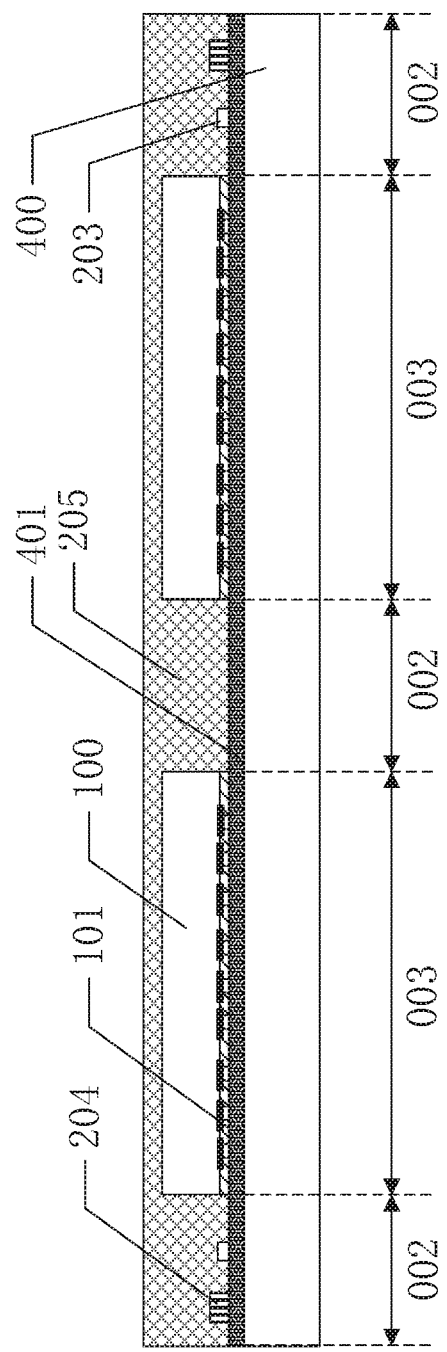
FIG. 6A is a schematic cross-sectional structural view of part of process steps (for forming a connection portion) in a semiconductor packaging method in one embodiment of the present disclosure.
Figure 6B:
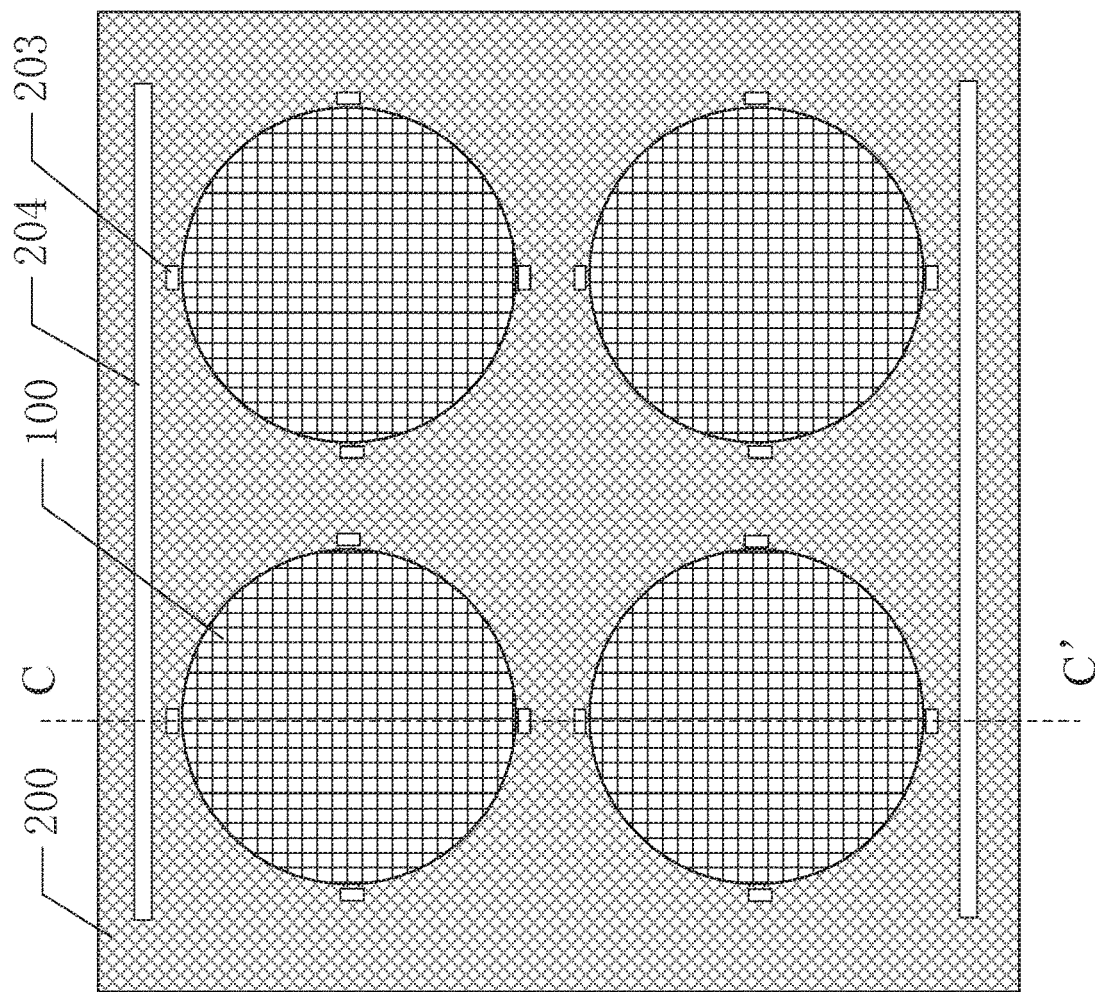
FIG. 6B shows a schematic plan view of part of process steps (for forming a connection portion) in a semiconductor packaging method in one embodiment of the present disclosure.

FIG. 6A shows a schematic cross-sectional view of part of a process step (for forming a connection portion) in a semiconductor package method of an embodiment. FIG. 6B shows a schematic plan view of part of a process step (for forming a connection portion) in a semiconductor package method of an embodiment. FIG. 6A is a cross-sectional view taken at line CC' of FIG. 6B. Although the active surface 101 of the wafer 100 in the cross-sectional view of FIG. 6A faces the lower carrier 400, various structures on the active surface of the wafer 100 are shown in the plan view of FIG. 6B for clarity of illustration.

In some embodiments of the present disclosure, as shown in FIG. 6A, the wafer 100 is placed on a carrier 400, and the active surface 101 of the wafer 100 faces the carrier 400. For example, in the case where a plurality of wafers 100 are provided, the plurality of wafers 100 may be separated from each other as shown in FIGS. 6A and 6B.

In some embodiments, as shown in FIGS. 6A and 6B, prior to placing the wafer 100 on the carrier 400, positioning members 203 may be disposed on the carrier 400 to indicate the location at which the wafer 100 is to be placed.

In some embodiments, as shown in FIGS. 6A and 6B, conductive members 204 may be formed on the carrier. As described above, the conductive members 204 may be used to form electrical contacts for the electroplating process.

After the wafer 100 is placed on the carrier 400, an encapsulation layer 205 is formed around the wafer 100 on the carrier. For example, the encapsulation layer 205 may be formed on the back surface of the wafer and around the wafer. For example, the encapsulation layer 205 may cover at least a portion of the carrier and completely cover the back and side surfaces of the wafer 100, thereby forming a panel assembly.

For example, the encapsulation layer 205 may be formed by employing paste printing, injection molding, hot press molding, compression molding, transfer molding, liquid encapsulant molding, vacuum lamination or other suitable molding methods.

For example, the encapsulation layer 205 may be an organic composite material, a resin composite material, a polymer composite material, a polymer composite material, such as an epoxy resin having a filler, an ABF (Ajinomoto buildup film), or other polymer having a suitable filler.

As shown in FIG. 6A, the encapsulation layer 205 includes a first portion 002 formed on the side surface of the wafer and a second portion 003 on the back surface of the wafer (e.g., the parts marked with dashed lines in FIG. 6A). The first portion 002 and the second portion 003 are integrally connected. In this case, the thickness of the encapsulation layer formed on the back surface of the wafer may be adjusted by adjusting the thickness of the encapsulation layer. Alternatively, after the encapsulation layer is formed, the thickness of the encapsulation layer on the back surface of the wafer may also be adjusted by polishing the encapsulation layer. Alternatively, the encapsulation layer may be polished to the back surface of the wafer, that is, the encapsulation layer is only present on the side surface of the wafer. However, having an appropriate thickness of the encapusulation layer remaining on the back surface of the wafer facilitates wafer stabilization and prevents wafer warpage. Moreover, after the wafer has gone through the packaging process and singulated into chips, a part of the encapsulation layer may remain on the back surface of the chip package, and the remaining encapsulation layer may protect the chip in the chip package and prevent the chip from warping. For the thickness of the encapsulation layer on the back surface of the wafer, the material properties and/or thickness of the encapsulation layer may be designed by computer simulation to match the material and/or thickness of the dielectric layer and the conductive layer on the active surface of the wafer to prevent warpage. That is, the second portion of the connection portion on the back surface of the wafer may have a predetermined material and thickness to slow down or to eliminate warpage of the panel assembly.

For example, in the case where the positioning members 203 and the conductive members 204 are employed, after the positioning members 203 and the conductive members 204 are formed and the wafer 100 is disposed on the carrier, the encapsulation layer 205 covers the wafer 100 and also the positioning members 203 and the conductive members 204, as shown in FIGS. 6A and 6B.

In some embodiments, as shown in FIG. 6A, an adhesive layer 401 may be formed on the carrier before the semiconductor wafer 100 is placed on the carrier. The adhesive layer 401 may be formed on one side of the carrier on which the wafer is placed by lamination, printing, spraying, coating, etc. In order to facilitate separation between the carrier 400 and the encapsulated panel assembly in a later process, the adhesive layer 401 may employ a material that is easily separable. In some embodiments, a thermal separation material is employed as the adhesive layer 401, as it is capable of losing adhesion under heating conditions. In other embodiments, the adhesive layer 401 has a two-layer structure: a thermal separation material structure layer and a wafer adhesion layer, wherein the thermal separation material structure layer is pasted on the carrier 400, and the wafer adhesion layer adheres to the wafer 100. To separate the panel assembly and the carrier 400, heat is applied to cause the thermal separation material structural layer to lose its adhesion, the carrier 400 is removed, and the adhesive layer 401 is removed from the surface of the panel assembly by peeling using mechanical force. At the same time, the wafer adhesion layer may be removed by chemical cleaning. After the adhesion layer 401 is removed, the remnant remaining on the surface of the chip may be removed by chemical cleaning.

Figure 7:
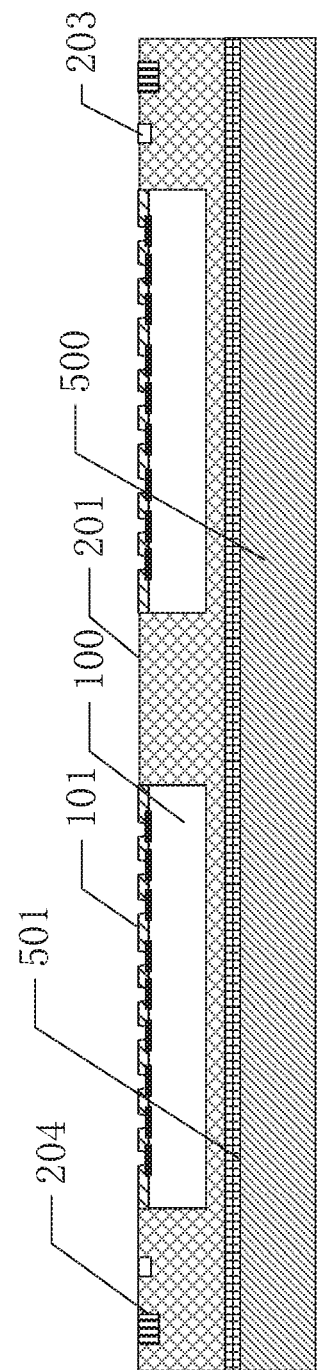
FIG. 7 is a cross-sectional structural view of part of process steps in a semiconductor packaging method in one embodiment of the present disclosure.

As shown in FIG. 7, after the encapsulation layer 205 is formed on the carrier on which the semiconductor wafer is disposed, the carrier is peeled off to expose the active surface of the semiconductor wafer 100. In this way, processing may be performed on the to-be-processed panel of the panel assembly. In addition, as shown in FIG. 7, after the panel assembly is peeled off from the carrier 400, the panel assembly may be placed on another carrier 500 in order to facilitate subsequent processing and enhance the strength of the panel assembly. The to-be-processed surface of the panel assembly (the surface on the same side as the active surface 101 of the wafer 100) faces away from the carrier 500. Similarly, an adhesive layer 501 may be disposed between the carrier 500 and the panel assembly. For example, various materials or parameters of the carrier 500 and the adhesive layer 501 may be set up with reference to the carrier 400 and the adhesive layer 401, and, as such, will not be described in detail herein.

After the panel assembly is formed, a conductive layer may be formed on the to-be-processed surface of the panel assembly. In some embodiments, the packaging process includes processes for forming seed layers, conductive traces, conductive pillars, dielectric layers and solders. These packaging processes will be exemplarily described below.

Figure 8A:
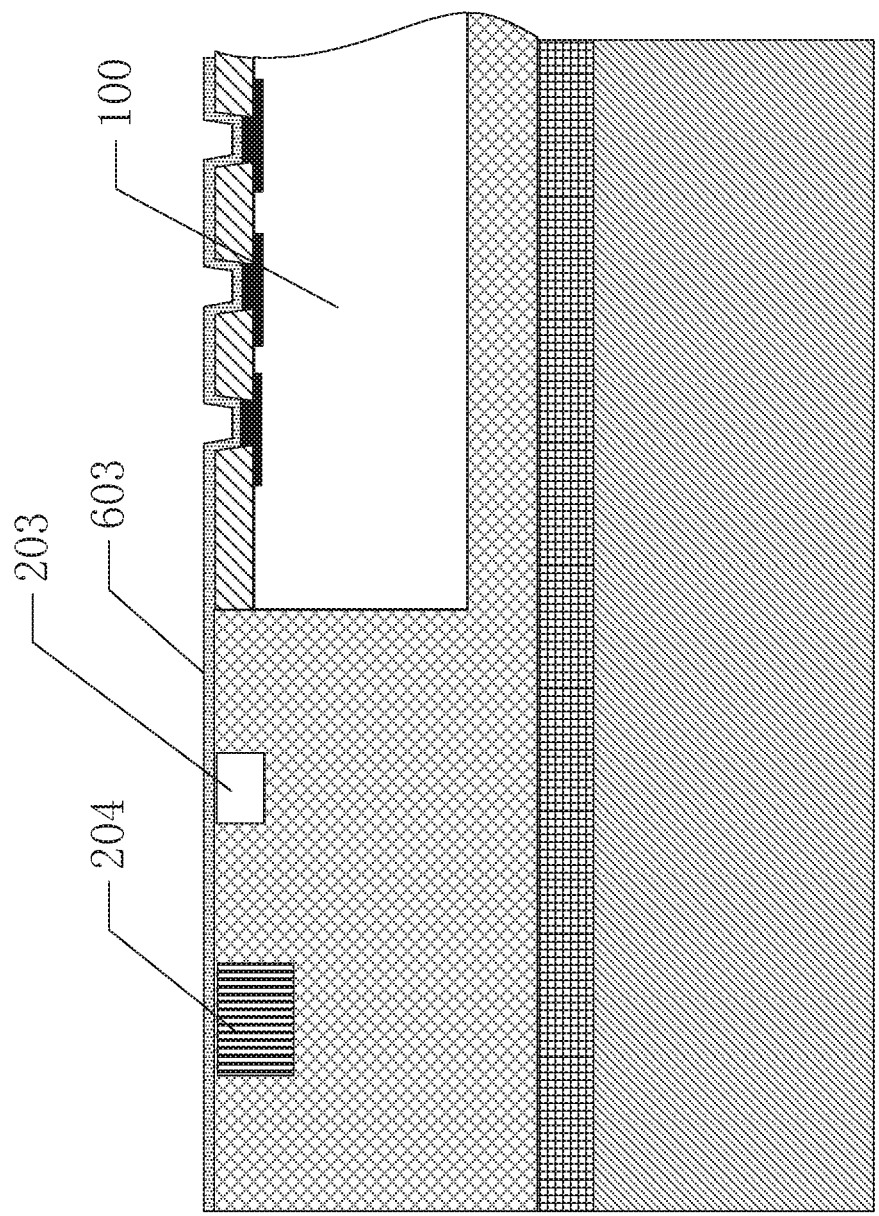
FIG. 8A is an enlarged partial cross-sectional view of a panel assembly after a seed layer is formed on its to-be-processed surface in a semiconductor device packaging method in one embodiment of the present disclosure.
Figure 8B:
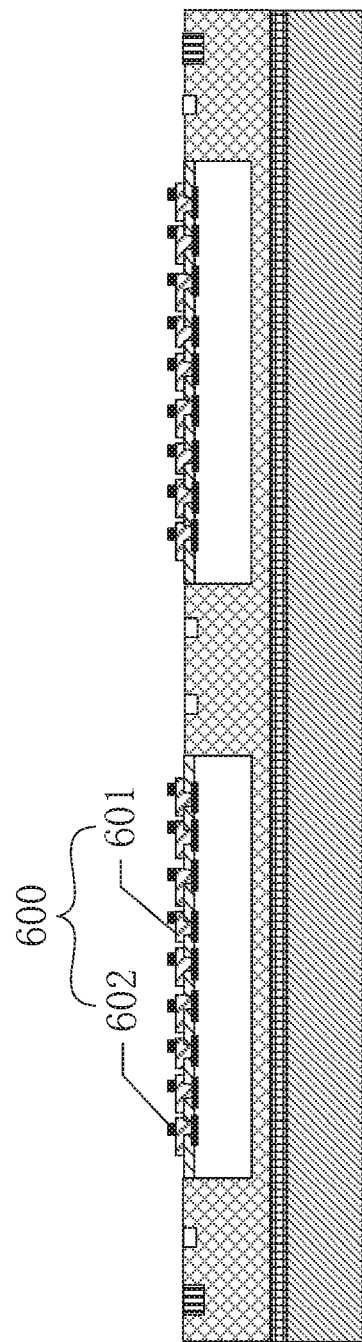
FIG. 8B is a schematic cross-sectional view of a panel assembly after a conductive layer is formed on its to-be-processed surface in a semiconductor device packaging method in one embodiment of the present disclosure.

FIG. 8A shows an enlarged partial cross-sectional view of a panel assembly after a seed layer 603 is formed on its to-be-processed surface. FIG. 8B shows a schematic cross-sectional view of a panel assembly after a conductive layer 600 is formed on its to-be-processed surface. The seed layer 603 is not shown in FIG. 8B for convenience of illustration.

For example, the process of forming the conductive layer 600 may include processes of forming conductive traces 601 and conductive pillars 602. For example, after forming the conductive layer, it may be patterned to form conductive traces 601 and conductive pillars 602 by photolithographic and etching processes. Alternatively, the conductive traces and conductive pillars may be formed by first forming a photoresist patterned mask and then forming a conductive layer at positions not covered by the patterned mask through an electroplating process. For example, a first patterned mask layer is formed on the to-be-processed surface of the panel assembly. The first patterned mask layer exposes areas where conductive traces are to be formed (e.g., at least part of the first surface of the wafer and at least part of the annular area), and an electroplating process is performed to form conductive traces 601 on the first surface of the wafer and in the annular area. Then, a second patterned mask layer is formed on the conductive traces 601, the second patterned mask layer exposes an area where conductive pillars are to be formed (e.g., at least part of the first surface of the wafer and at least part of the annular area), and an electroplating process is performed to form the conductive pillars 602, which are connected to the conductive traces 601, on the conductive traces 601. The specific formation method of the conductive layer is not particularly limited in the embodiments of the present disclosure, and the conductive traces 601 and the conductive pillars 602 may be formed by any suitable method in the related art which will not be described in detail herein. After the conductive traces 601 and the conductive pillars 602 are formed, the excess seed layer 603 may be removed by etching, thereby avoiding short circuits between adjacent conductive traces.

Figure 9A:
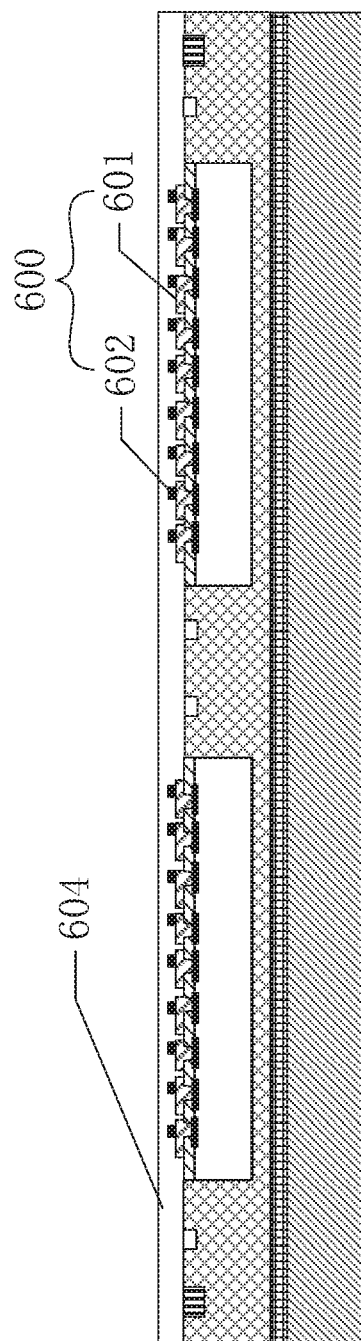
FIG. 9A is a schematic cross-sectional view after a dielectric layer is formed on a panel assembly which a conductive layer is formed thereon in a semiconductor packaging method in one embodiment of the present disclosure.

In some embodiments of the present disclosure, a dielectric protective layer may also be formed over the conductive layer 600 after it is formed. As shown in FIG. 9A, a dielectric layer 604 is formed on the conductive layer on the panel assembly which the conductive layer 600 is formed thereon. The dielectric layer 604 may be used to protect the formed conductive layer 600. For example, the dielectric layer 604 may completely cover the conductive layer 600 and at least part of the area of the connection portion.

Figure 9B:
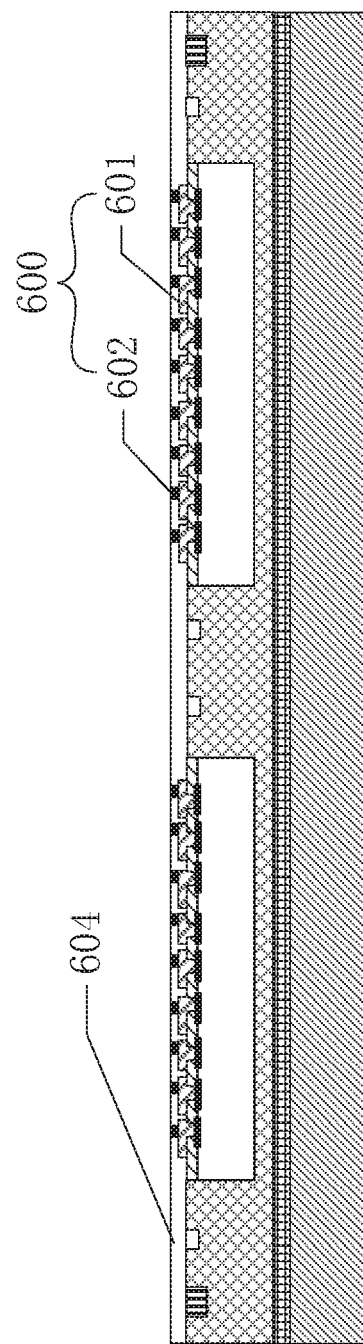
FIG. 9B is another schematic cross-sectional structural view after a dielectric layer is formed on a panel assembly which a conductive layer is formed thereon in a semiconductor packaging method in one embodiment of the present disclosure.

In some embodiments of the present disclosure, as shown in FIG. 9B, after the dielectric layer 604 is formed, the dielectric layer 604 is thinned to expose the conductive pillars for connection with other components.

Figure 9C:
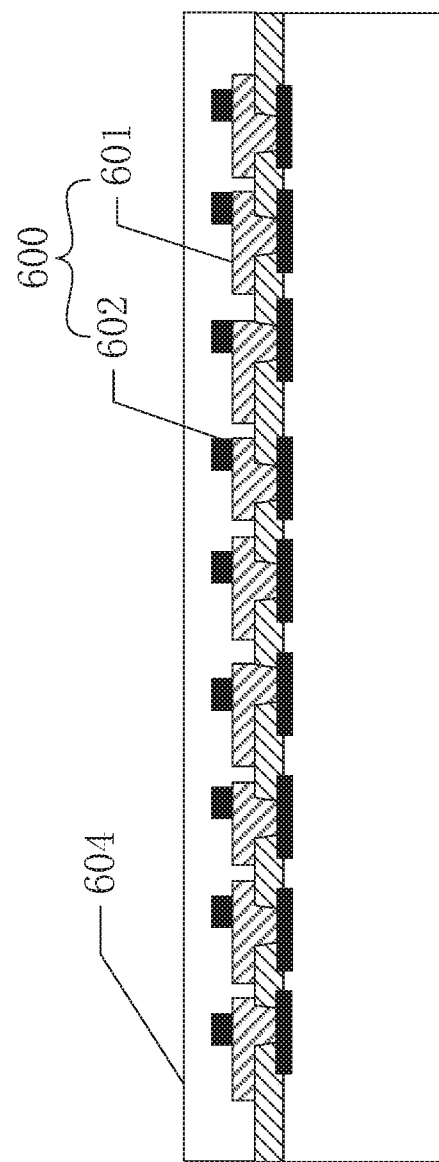
FIG. 9C is a schematic cross-sectional view after a dielectric layer is formed on a wafer which a conductive layer is formed thereon in a semiconductor packaging method in one embodiment of the present disclosure.
Figure 9D:
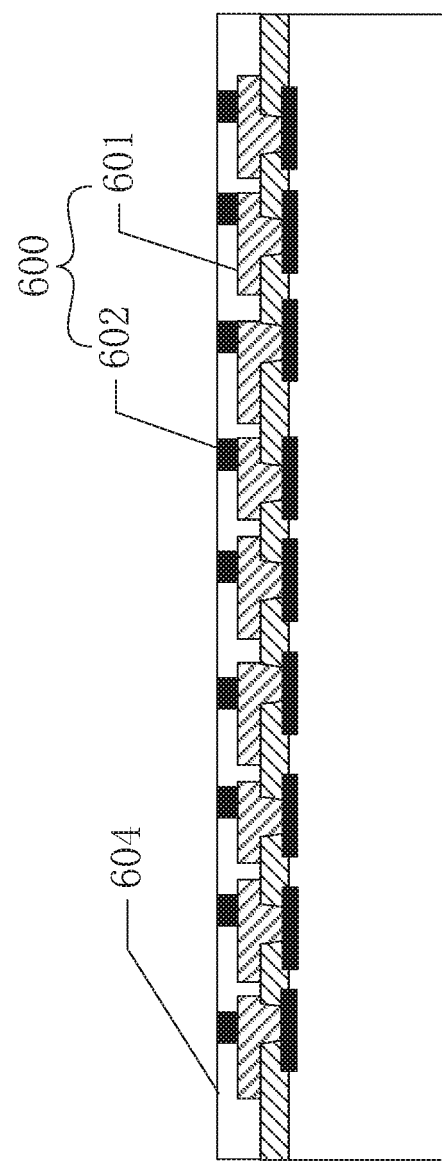
FIG. 9D is another schematic cross-sectional view after a dielectric layer is formed on a wafer which a conductive layer is formed thereon in a semiconductor packaging method in one embodiment of the present disclosure.

FIGS. 9A and 9B illustrate the steps of forming the dielectric layer 604 on the to-be-processed surface after the conductive layer 600 is formed on the panel assembly, but embodiments of the present disclosure are not limited thereto. For example, FIGS. 9C and 9D illustrate another embodiment of the formation of the dielectric layer 604. In the embodiment shown in FIGS. 9C and 9D, after the conductive layer is formed on the active surface of the wafer of the panel assembly, the wafer 100 is separated from the panel assembly to form an individual wafer structure. Then, the dielectric layer 604 is formed on the active surface of the wafer 100 with the conductive layer 600. The dielectric layer 604 on the wafer 100 is then thinned to expose the formed conductive pillars 602 to enable electrical connection with other components.

The steps of thinning the dielectric layer 604 in the various embodiments described above may be accomplished, for example, by mechanical polishing. However, the method of exposing the conductive pillars is not limited thereto. For example, vias may be formed in the dielectric layer 604 to expose the conductive pillars.

Although not shown in the drawings, the above-mentioned conductive layer 600 may not include the conductive pillars 602. In this case, after the dielectric layer 604 is formed, vias may be formed in the dielectric layer 602 to expose parts of the conductive traces 601 that need to be electrically connected, and bumps are formed in the vias to electrically connect with other components, such as solder bumps.

In some embodiments of the present disclosure, for example, after the dielectric layer 604 exposing the conductive layer is formed on the panel assembly, as illustrated in FIG. 9B, the wafers are separated to form individual wafer structures.

For example, the material of the conductive traces 601 and the conductive pillars 602 may be gold, silver, copper, tin, aluminum, other suitable conductive materials, or a combination thereof.

Figure 10:
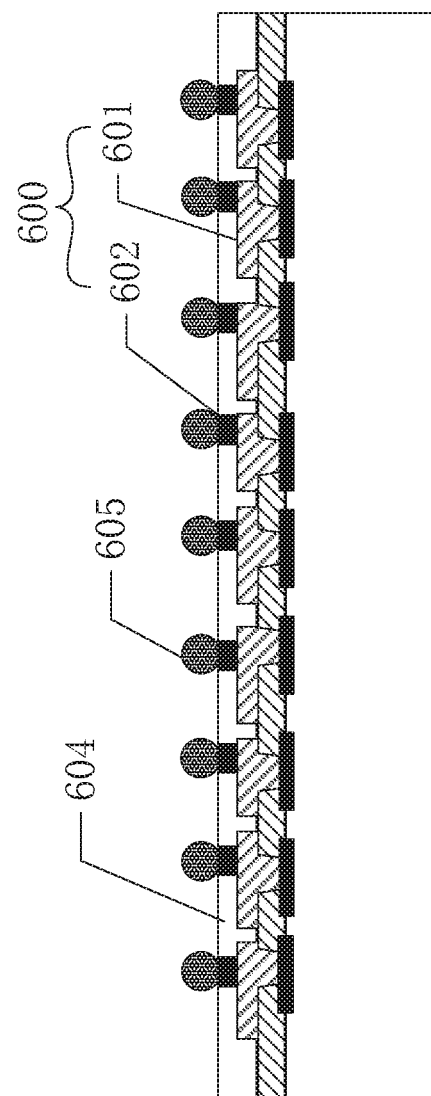
FIG. 10 is a schematic cross-sectional view after solder is formed on a dielectric layer in a semiconductor packaging method in one embodiment of the present disclosure.

As shown in FIG. 10, on the wafer which the dielectric layer 604 is formed thereon, solder 605 is formed to be electrically connected to the conductive pillars 602 exposed by the dielectric layer 604. Alternatively, in other embodiments, the solder 605 is electrically connected to the conductive traces through bumps in the vias of the dielectric layer, which is not specifically limited in this embodiment of the present disclosure.

The above embodiments describe the processes of the formation of a conductive layer on the panel assembly and the formation of solder on the wafer after the conductive layer is formed. Although the wafer 100 is used as an example in the embodiments of forming of the conductive layer and the solder, the wafer 100' in FIGS. 3A and 3B and the panel assembly in FIGS. 3C, 4A and 4B are also applicable to these embodiments. As long as the vias 1061 are formed in the dielectric layer 106 before the formation of the conductive layer 600, the conductive layer 600 may be electrically connected to the die pads on the wafer through the vias 1061.

In addition, it should be noted that in the embodiment of FIGS. 8B to 10, although the conductive layer 600 is formed only on the active surface 101, the conductive layer may also be formed by employing the method which forms the conductive layer 600 on the connection portion of the periphery of the wafer in the embodiment shown in FIGS. 5A and 5B, and the details will not be described herein.

Forming a panel assembly by packaging the wafer using the encapsulation layer 205 is described as an exemplary embodiment above. However, embodiments of the present disclosure are not limited thereto. As long as a connection portion is formed on the side surfaces of the wafer, the plurality of wafers included in the panel assembly may be processed simultaneously, which greatly improved efficiency. Further, the presence of the connection portion may avoid direct clamping of the wafer during processing. In addition, it is also possible to prevent the uneven thickness of the conductive layer from being formed on the active surface of the wafer by forming the dummy conductive layer as described above. Other methods in some embodiments of the present disclosure for forming a panel assembly are described below.

Figure 11A:
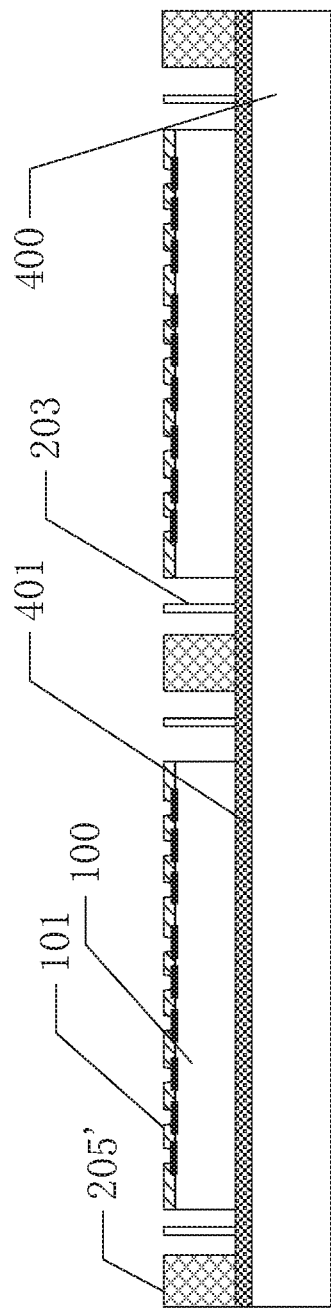
FIGS. 11A-11B are schematic cross-sectional views of another form of a panel assembly in a semiconductor packaging method in one embodiment of the present disclosure.
Figure 11B:
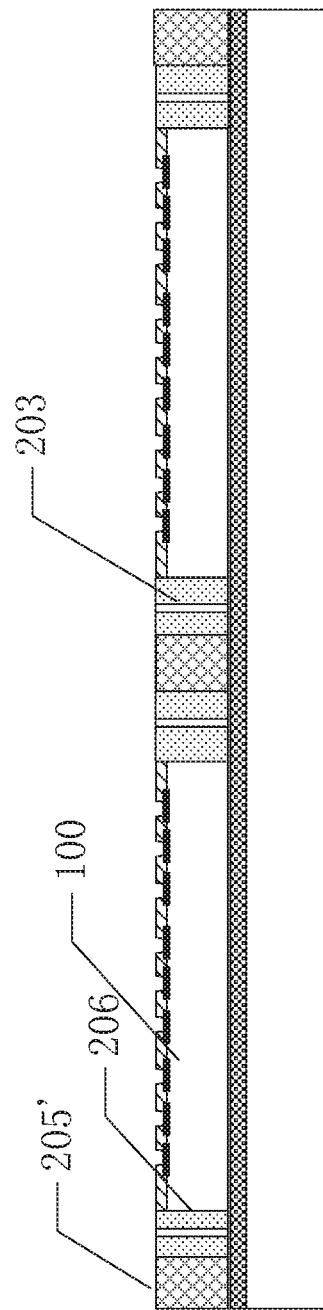

FIGS. 11A-11B are schematic cross-sectional views of another embodiment of the present disclosure for forming a panel assembly. As shown in FIG. 11A, the wafer 100 is placed on the carrier 400, with the back surface 102 of the wafer 100 facing the carrier 400. Then, a cavity mold 205' with a through opening is disposed on the carrier 400, so that the wafer 100 is positioned within the opening. For example, the shape of the opening may be substantially the same as the shape of the wafer, and the diameter of the opening is larger than the diameter of the wafer. As shown in FIG. 11B, a fixing material 206 is formed in a gap between the opening sidewall of the cavity mold 205' and the side surface of the wafer 100 to connect the wafer to the cavity mold in order to form a panel assembly. The fixing material may be an adhesive material, and the embodiment of the present disclosure is not particularly limited thereto. For example, in this embodiment, the active surface 101 of the wafer in the panel assembly is away from the carrier 400, and therefore, after the panel assembly is formed, the active surface 101 may remain on the carrier 400 at all times during the formation of the conductive layer, thereby increasing the strength of the panel assembly. However, the embodiments of the present disclosure are not limited thereto, and the panel assembly may be separated from the carrier.

As may be seen from FIG. 11A and FIG. 11B, the positioning members 203 may be disposed on the carrier 400 before the wafer 100 is placed thereon. An adhesive layer 401 may also be disposed between the carrier and the wafer. The arrangement and material of the positioning members 203 and the adhesive layer 401 may be the same as those in the above embodiments, and will not be described in detail herein.

Figure 12A:
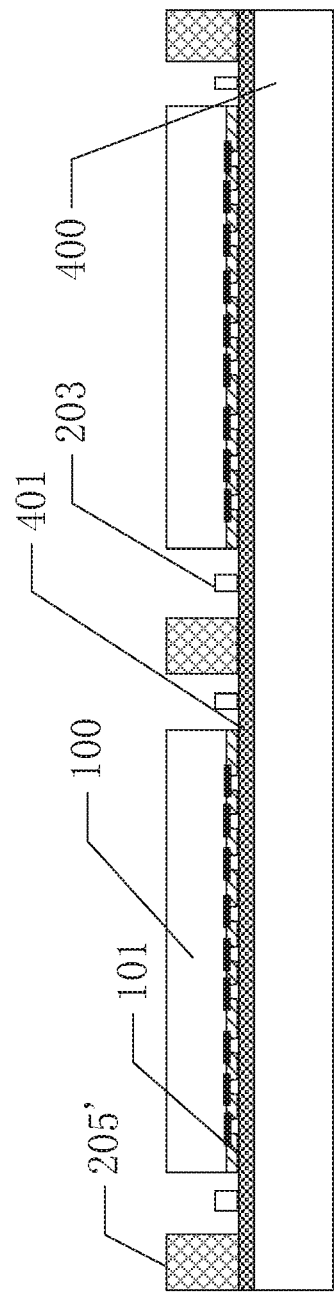
FIGS. 12A-12C are schematic cross-sectional views of yet another form of a panel assembly in a semiconductor packaging method in one embodiment of the present disclosure.
Figure 12B:
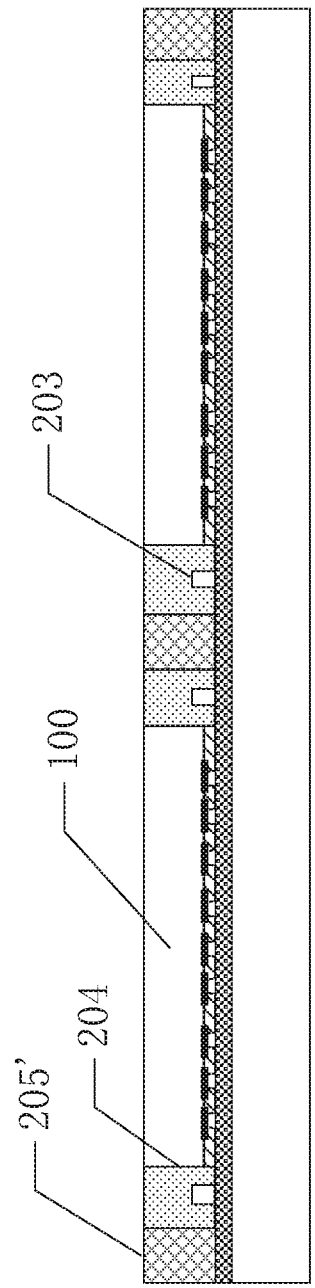
Figure 12C:
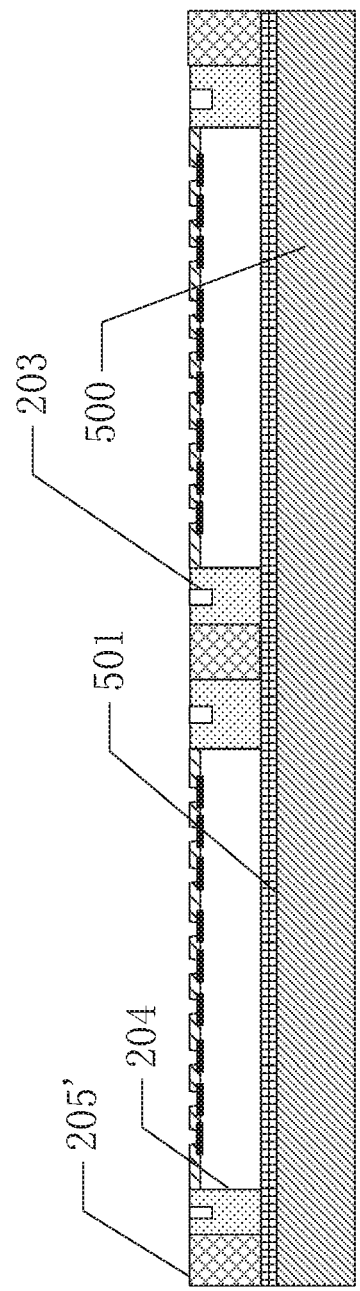

FIGS. 12A-12C are schematic cross-sectional views of forming a panel assembly in another embodiment of the present disclosure. As shown in FIG. 12A, the wafer 100 is placed on the carrier 400, with the active surface 101 of the wafer 100 facing the carrier 400. Then, a cavity mold 205' with a through opening is disposed on the carrier 400, so that the wafer 100 is positioned within the opening. As shown in FIG. 12B, a fixing material is formed in a gap between the opening sidewall of the cavity mold and the side surface of the wafer 100 to connect the wafer to the cavity mold, thereby forming a panel assembly. As shown in FIG. 12C, the panel assembly in the structure shown in FIG. 12B is peeled off from the carrier 400. To enhance the strength of the panel assembly, the panel assembly may be placed on another carrier 500, with the active surface of the wafer of the panel assembly facing away from the carrier 500, so that the active surface may be exposed for subsequent processing.

As may be seen from FIGS. 12A-12C, in this embodiment, the positioning members 203 may be disposed on the carrier 400 before the wafer 100 is placed thereon. An adhesive layer 401 may be disposed between the carrier 400 and the wafer. An adhesive layer 501 may also be disposed between the carrier 500 and the panel assembly. The arrangement and material of the positioning members 203, adhesive layer 401 and adhesive layer 501 may be the same as those in the above embodiments, and will not be described in detail herein again.

For example, the material of the above cavity mold 205' may be, for example, a conductive material. In this case, the steps of forming the conductive members in the embodiments of the above-described FIGS. 5A and 5B or FIGS. 6A and 6B may be omitted. In one embodiment, the material of the cavity mold may be made from FR4 material. The FR4 material is, for example, a resin fiber board having a copper layer on its surface, and therefore, it may conduct electricity.

For example, the method of forming a connection portion by using a cavity mold 201' having an opening is different from the above-described method of packaging a wafer by an encapsulation layer. The connection portion formed by using the cavity mold 201' does not include any portion disposed on the back surface of the wafer. Thus, the thickness of the cavity mold 201' may be substantially the same as the thickness of the wafer so as to form a relatively flat to-be-processed surface on the panel assembly.

It should be noted that the subsequent processing performed on the formed panel assembly shown in the embodiment of FIGS. 11A-12C may employ various steps and processes described in the above embodiments of FIGS. 8A-10. For example, the steps of forming the seed layer 603, conductive traces 601, conductive pillars 602, dielectric layer 604 and solder 605, etc. may employ the processes, materials, and various parameters described in the above embodiments. Therefore, for the sake of brevity, the repeated content will not be described herein.

Also, it should be noted that although the wafer 100 is used as an example in describing the embodiments of FIGS. 11A-12C, the wafer 100' of FIGS. 3A and 3B and the panel assembly of FIGS. 3C, 4A and 4B are also applicable to these embodiments.

Figure 15A:
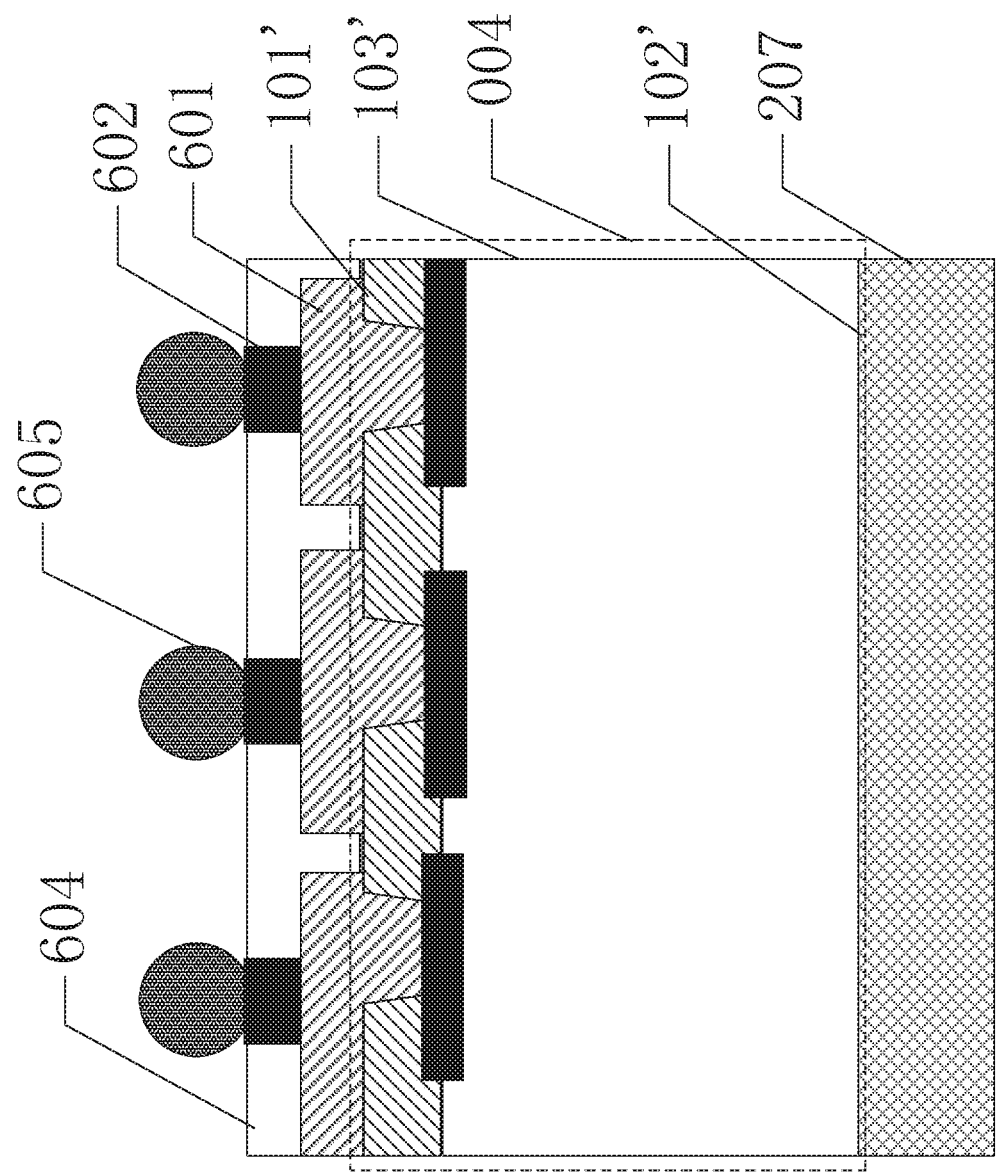
FIGS. 15A-15D are schematic cross-sectional views of a semiconductor chip package in one embodiment of the present disclosure.
Figure 15B:
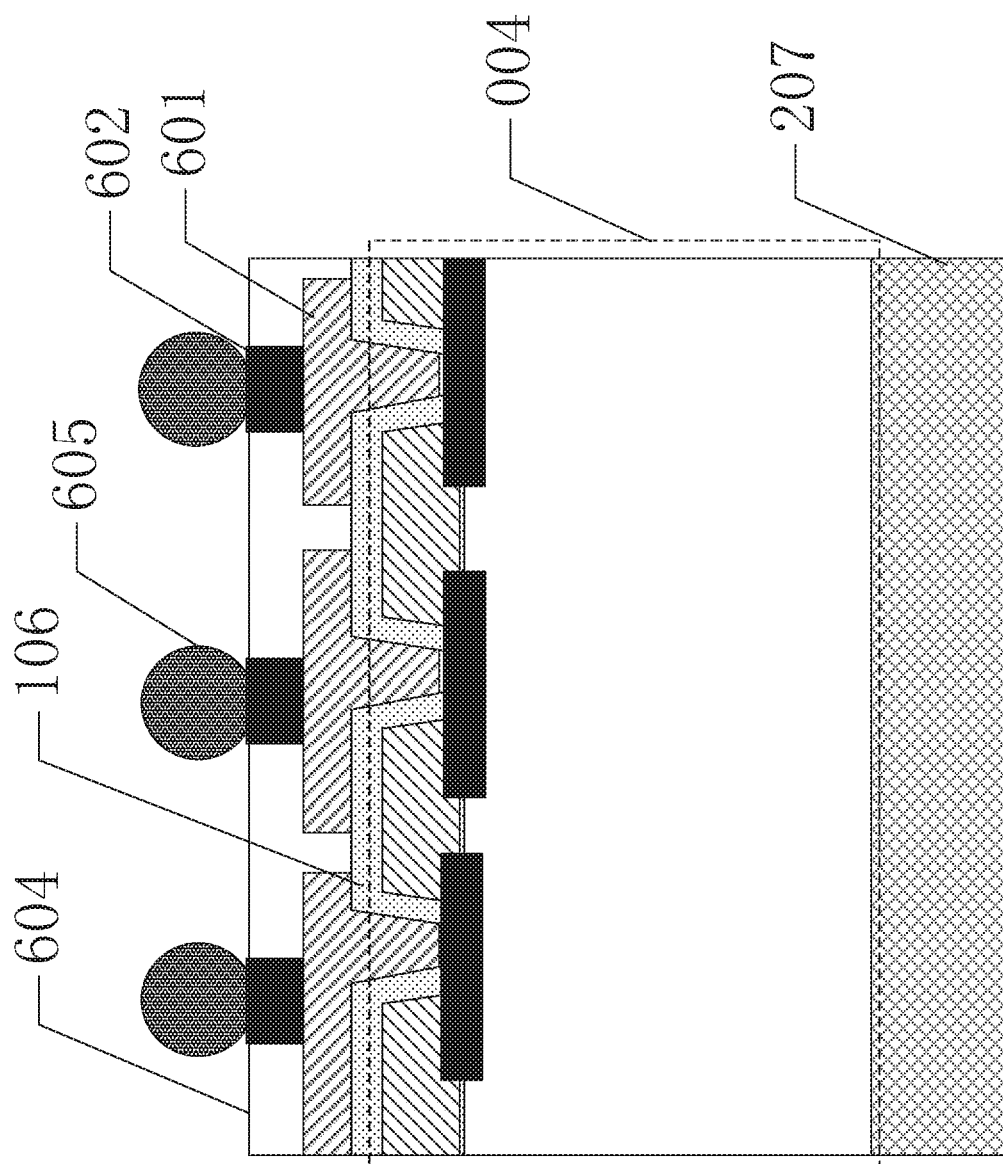
Figure 15C:
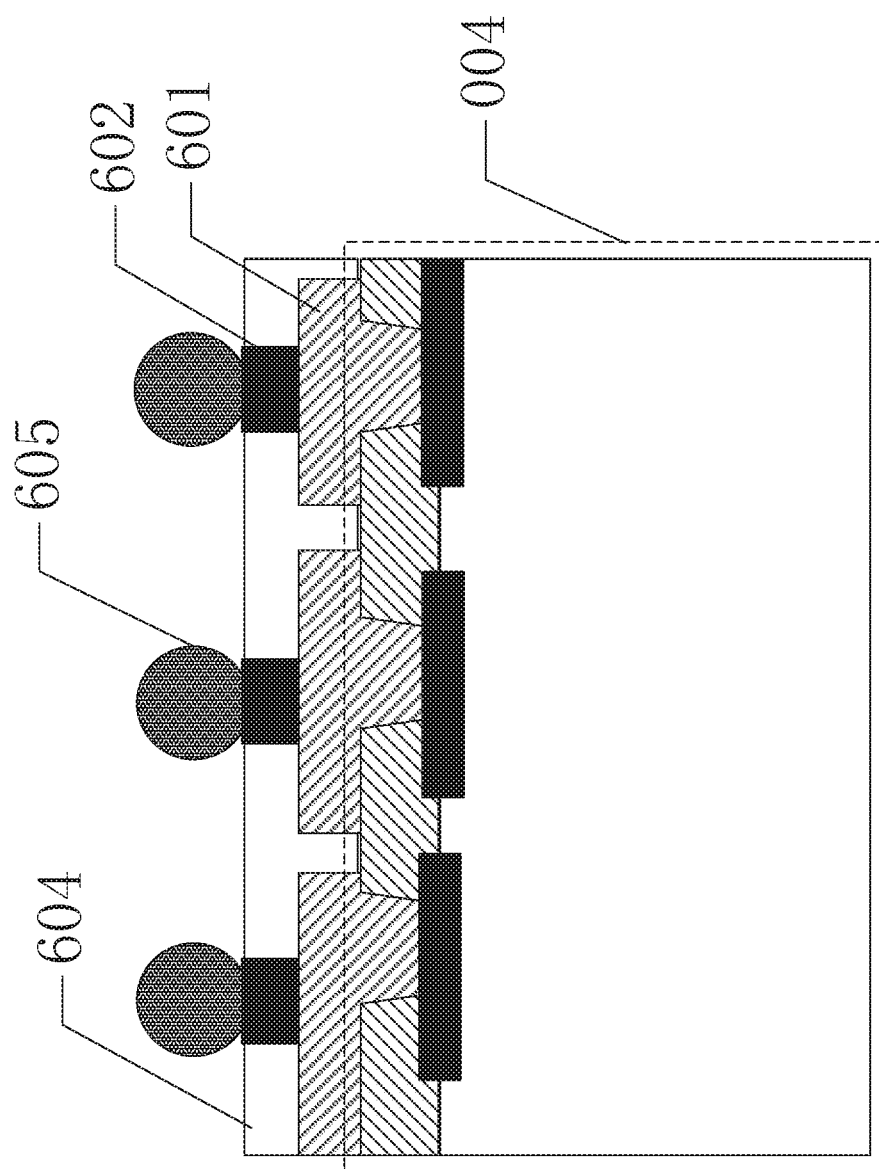
Figure 15D:
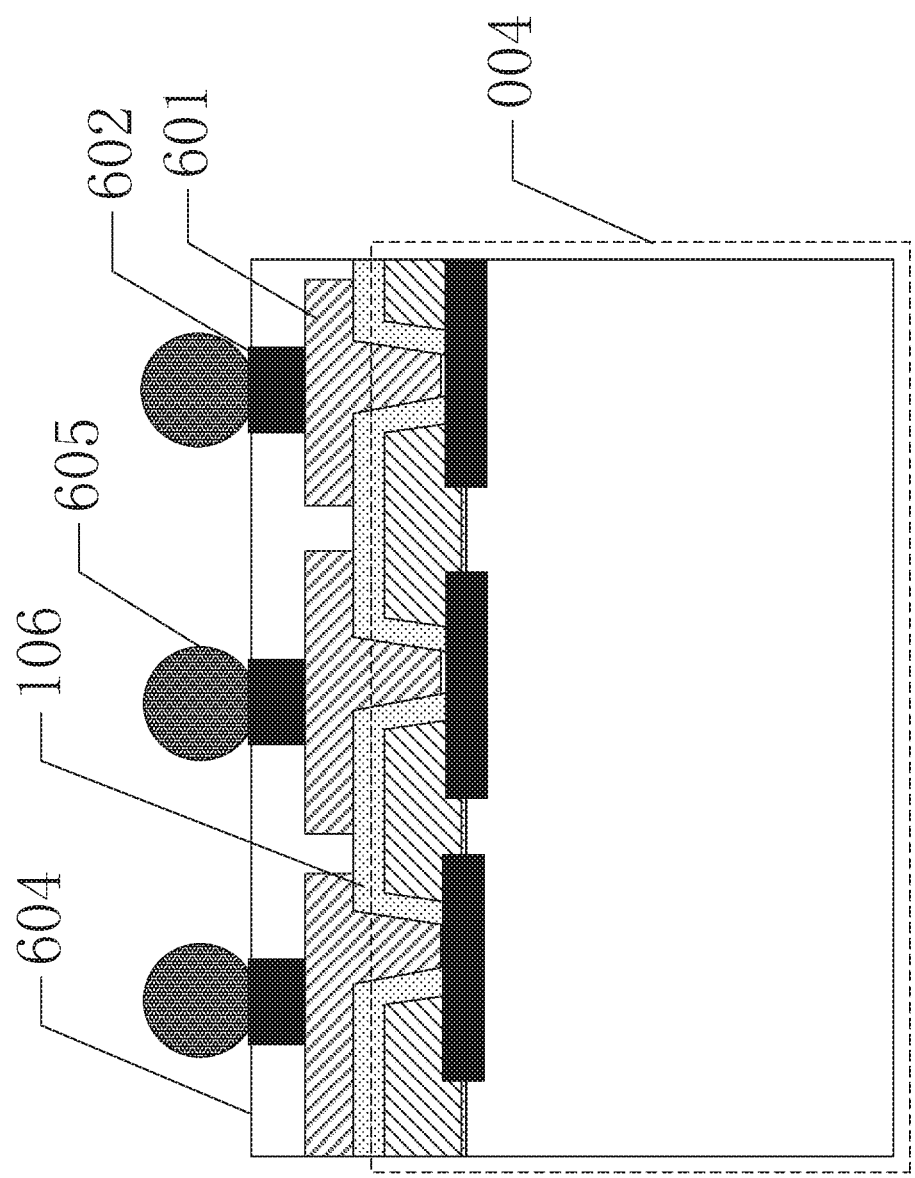

After the solder is formed, the semiconductor package process of the embodiments of the present disclosure may further include singulating the wafer into individual chip packages. For example, as shown in FIGS. 15A and 15B, individual chip packages may be formed after the wafer is singulated. FIGS. 15A and 15B show the chip package obtained after singulation in the case where the connection portion is formed on the side and back surfaces of the wafer. For example, these structures may correspond to the panel assembly fabrication process of FIGS. 6A-9B. In this case, the back surface of the chip package may also include the part of the connection portion remaining on the back surface of the wafer, which forms the back surface protective layer 207 of the chip package. The other structures illustrated in FIGS. 15A and 15B use the same reference numbers as the above-described panel assembly fabrication, and the description of the various structures may also be applicable to the above-described embodiment regarding the panel assembly. The part of the connection portion remaining on the back surface of the wafer advantageously enhances the structural strength of the chip. FIGS. 15C and 15D correspond to the panel assembly fabrication process of FIGS. 11A-12C. In addition, in the chip package shown in FIGS. 15B and 15D, a dielectric layer 106 is further included between the conductive layer 600 and the die 004 (i.e., the part cut out of the wafer itself), and the chip package corresponds to the fabrication process of the panel assembly on which a dielectric layer is formed prior to the formation of the conductive layer in FIGS. 3A-4B.

The semiconductor device packaging methods of some embodiments of the present disclosure have been described above. However, the steps, structures or materials, etc. of the above various embodiments may be combined or replaced with each other if there is no conflict. It should be noted that forming a layer on a certain surface is not limited to forming the layer directly on the surface, rather, it may also include inserting other layers between the surface and the layer.

Another panel assembly and semiconductor chip package may also be provided in the embodiment of the present disclosure. For example, the panel assembly is the panel assembly formed using the semiconductor device packaging method described in the above embodiment and the semiconductor chip package is obtained after the package is singulated. Therefore, all the description in the embodiments of the above semiconductor device packaging method is applicable to the panel assembly and the semiconductor package.

For example, as shown in FIG. 2A, the panel assembly 300 includes at least one wafer 100, the wafer 100 includes a first surface (active surface) 101 and a second surface (back surface) 102 opposite to each other, and a side surface 103 connecting the first surface 101 and the second surface 102, the first surface 101 being an active surface. For example, die pads 103 connected to the internal circuit structure of the wafer 100 is formed on the active surface 101 of the wafer 100. In addition, the panel assembly 300 further includes a connection portion 200, which is on the side surface 103 of the wafer 100 and connected to the wafer 100. For example, the connection portion 200 includes a third surface (front surface) 201 which is on the same side as the first surface 101 of the wafer 100, and a fourth surface (rear surface) 202 which is on the same side as the second surface 102 of the wafer 100. The third surface 201 of the connection portion 200 and the first surface 101 of the wafer 100 form the to-be-processed surface of the panel assembly 300. For example, the packaging process steps of forming a conductive layer, etc. may be performed on the to-be-processed surface of the panel assembly.

For example, as shown in FIG. 2A, the first surface 101 of the wafer may be substantially coplanar with the third surface 201 of the connection portion 200, so that the subsequent processing steps may be conveniently performed on the to-be-processed surface, which is formed by both the first surface 101 of the wafer 100 and the third surface 201 of the connection portion 200.

For example, as shown in FIG. 8B, the panel assembly may also include a conductive layer 600, which is on the to-be-processed surface and covers at least the active side of the wafer.

For example, as shown in FIG. 6A, the connection portion 200 includes the first part on the side surface of the wafer 100 and the second part on the second surface 102 of the wafer 100, the first part and the second part are integrally connected. For example, the connection portion includes an encapsulation layer.

For example, as shown in FIG. 11B or 12C, the connection portion 200 includes a cavity mold 201' with a through opening. The wafer 100 is disposed in the opening. A fixing material is formed in a gap between the opening sidewall and the side surface of the wafer so that the wafer 100 is connected to the cavity mold 205'. For example, the thickness of the cavity mold is substantially the same as the thickness of the wafer.

For example, as shown in FIG. 8B, 11B or 12C, the panel assembly further includes positioning members 203. The positioning component 203 is disposed on the periphery of the wafer for positioning the wafer. For example, in the structure shown in FIG. 8B, the positioning members 203 are embedded in the encapsulation layer 205. In the structures shown in FIGS. 11B and 12C, the positioning members 203 are disposed in the gap between the opening sidewall of the cavity mold and the side surface of the wafer, and is embedded in the fixing material 204.

For example, as shown in FIGS. 5A and 5B, the panel assembly may further include conductive members 204, which are in the peripheral area of the to-be-processed surface of the panel, exposed in the third surface of the connection portion and away from the wafer.

For example, as shown in FIGS. 11B and 12C, the material of the cavity mold includes a conductive material, and therefore, the cavity mold itself may be used as an electrical contact point in the plating process, eliminating the steps of separately fabricating the conductive members. For example, the material of the cavity mold includes FR4 material.

For example, as shown in FIG. 3C, in the panel assembly, a dielectric layer 106 is included on the active surface of the wafer. For example, the panel assembly of FIG. 3C corresponds to the embodiments in FIGS. 3A and 3B, in which the dielectric layer 106 is formed on the wafer prior to combining the wafers into the panel assembly. Thus, in such a panel assembly, the surface of the dielectric layer 106 of the wafer in the panel assembly may be substantially flush with the third surface of the connection portion.

For example, as shown in FIGS. 4A and 4B, the to-be-processed surface of the panel assembly includes a dielectric layer 106. For example, the panel assembly corresponds to the embodiments in FIGS. 4A and 4B, in which the dielectric layer 106 is formed on the to-be-processed surface of the panel assembly after the panel assembly is formed. Thus, in such a panel assembly, the dielectric layer on the panel assembly may be formed on the first surface of the wafer or on the third surface of the connection portion.

Figure 13:
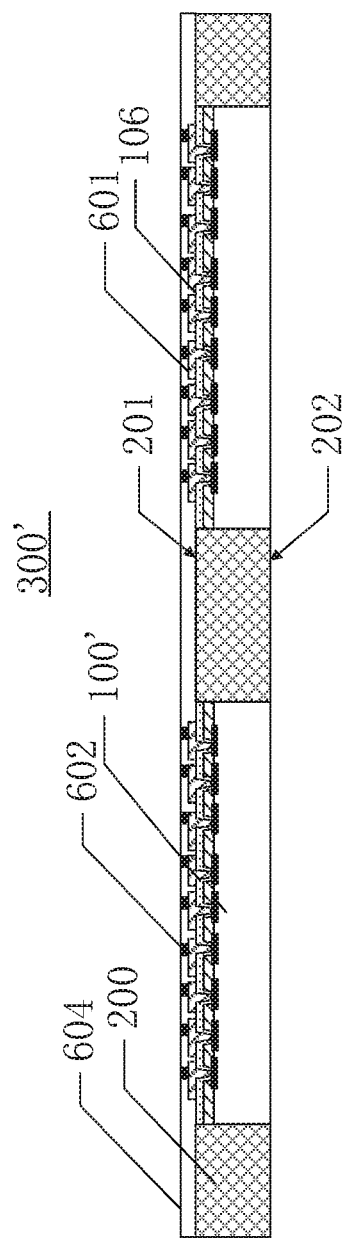
FIG. 13 is a schematic cross-sectional view of a panel assembly in one embodiment of the present disclosure.

For example, as shown in FIG. 13, the panel assembly further includes a conductive layer on the side of the dielectric layer 106 that is remote from the wafer (e.g., it may include conductive traces 601 and conductive pillars 602), and a dielectric layer 604 on the side of the conductive layer that is remote from the wafer. The dielectric layer 604 covers at least part of the conductive layer. Thus, the panel assembly includes the dielectric layer 106 between the conductive layer and the wafer as shown in FIGS. 3A and 3B. It may also include the dielectric layer 604 on the side of the conductive layer which is remote from the wafer, as shown in FIGS. 9A and 9B. In addition, although the dummy conductive layer is not shown in the drawing, the dummy conductive layer may be added according to the embodiments shown in FIGS. 5A and 5B.

It should be noted that, for the materials, structures or technical effects, etc. which are not mentioned in the descriptions of the panel assembly, reference may be made to the embodiments of the above semiconductor device packaging methods, and the details are not described herein again.

Figure 14A:
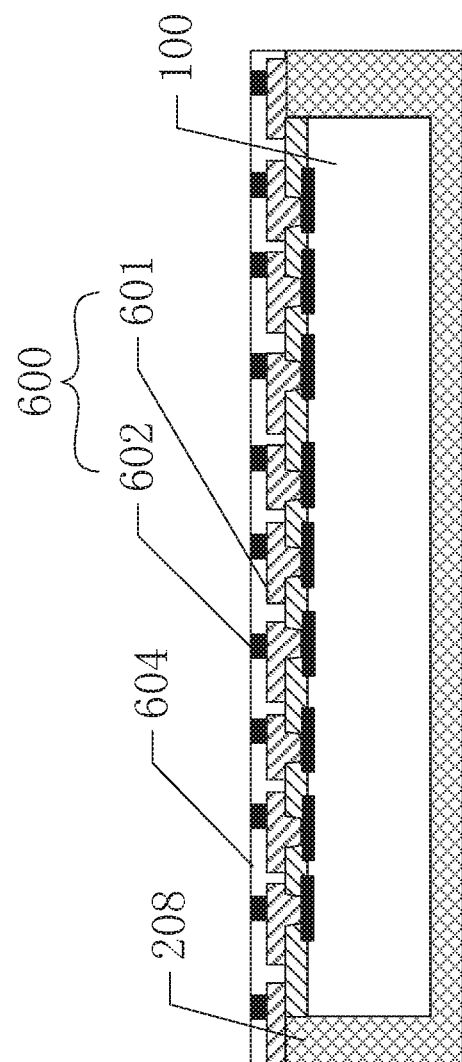
FIGS. 14A-14C are schematic cross-sectional views of a wafer package in one embodiment of the present disclosure.
Figure 14B:
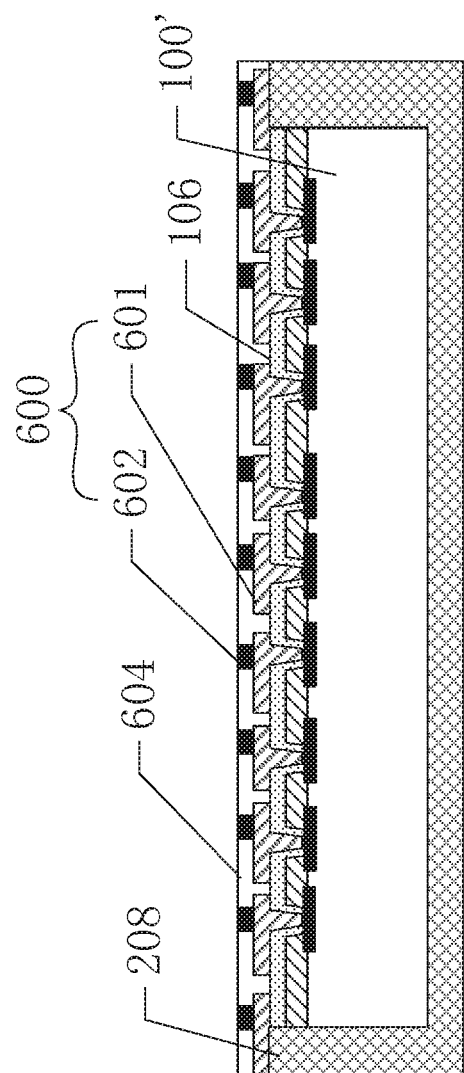
Figure 14C:
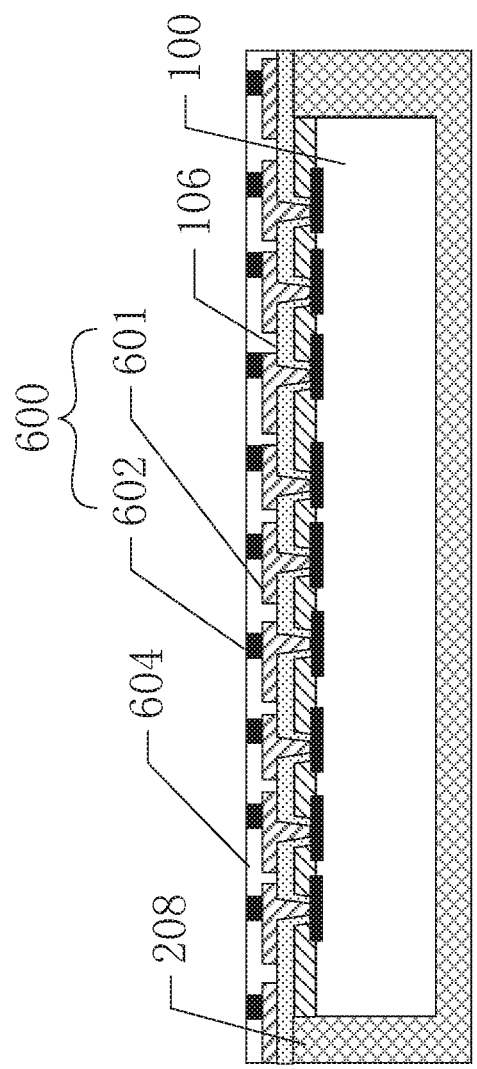

A wafer package singulated from the above panel assembly is also provided in the embodiments of the present disclosure. FIGS. 14A-14C show schematic cross-sectional views of several exemplary wafer packages in the embodiments of the present disclosure. As shown in FIG. 14A, an encapsulation layer 208 is disposed on the side surface and second surface of the wafer 100. For the structure of the wafer 100, reference may be made to the description in the above embodiments, and the details are not described herein again. Although FIG. 14A illustrates that the encapsulation layer is on the side surface and the second surface of the wafer 100, the embodiments of the present disclosure are not limited thereto, and the encapsulation layer 208 may be disposed on at least one of the side surface and the second surface of the wafer 100. For example, the wafer package further includes a conductive layer 600 which is on at least the first surface of the wafer. In some examples, the conductive layer 600 may include an active conductive layer on the first surface of the wafer and a dummy conductive layer on the encapsulation layer of the side surface of the wafer. Additionally, a dielectric layer 604 covering at least part of the conductive layer may also be disposed on a side of the conductive layer remote from the wafer 100. FIGS. 14B and 14C illustrate cross-sectional schematic views of a wafer package in accordance with another embodiment of the present disclosure. FIG. 14B differs from FIG. 14A in that the wafer package further includes a dielectric layer 106 on the side of the conductive layer near the wafer, and the dielectric layer 106 is formed only on the first surface of the wafer. For example, the surface of the dielectric layer 106 is flush with the front surface of the encapsulation layer. FIG. 14C differs from FIG. 14A in that the wafer package further includes a dielectric layer 106 on the side of the conductive layer near the wafer, and the dielectric layer 106 is formed on the first surface of the wafer and the front surface of the encapsulation layer. For example, in the case whereby the encapsulation layer includes a part disposed on the second surface of the wafer, this part may be designed to have predetermined material and thickness to slow down or eliminate warpage of the wafer package.

It should be noted that the wafer package in the embodiments of the present disclosure is, for example, a structure singulated from the foregoing panel. The structure may include a part of the connection portion remaining on the side surface and/or the second surface of the wafer during the process of singulating the wafer. Therefore, for the materials, structures or technical effects, etc. which are not mentioned in the description of the wafer package, reference may be made to the embodiments of the above panel assembly, and the details are not described herein again.

Another embodiment of a semiconductor chip package is also provided in the present disclosure. As shown in FIG. 15A, the semiconductor chip package includes a die 004, the die includes a first surface 101' and a second surface 102' opposite to each other, and a side surface 103 connecting the first surface 101' and the second surface 102', the first surface 101' being an active surface. For example, the first surface 101' and the second surface 102' of the die 004 are parts of the first surface 101 and the second surface 102 of the wafer respectively, and the side surface 103' is a new cut surface. In addition, as shown in FIG. 15A, an encapsulation layer 207 is further disposed on the second surface 102' of the die 004. As described in the foregoing embodiments, the encapsulation layer formed on the back surface of the wafer may remain on the chip package formed after singulation. Therefore, the material properties and/or thickness of the encapsulation layer are designed by computer simulation to match the material and/or thickness of the dielectric layer and the conductive layer on the active surface of the wafer, thereby also preventing warpage of the chip package. However, the above-described methods of obtaining the properties and/or thickness of the encapsulation layer material are not limited to computer simulation, and experiments and measurements may be employed to optimize the design.

In addition, as shown in FIG. 15A, the semiconductor chip package may further include a conductive layer 600 (e.g., including conductive traces 601 and conductive pillars 602) on the first surface 101' of the die 004. For example, the die 004 includes a circuit structure disposed on the first surface and die pads exposed in the first surface, the conductive layer is electrically connected to the die pads of the die.

For example, as shown in FIG. 15B, the semiconductor chip package may further include a dielectric layer 106 disposed between the conductive layer 600 and the die 004. For example, the dielectric layer 106 includes vias that expose the die pads of the die 004, and the conductive layer 600 is connected to the die pads through the vias in the dielectric layer 106. For example, as shown in FIG. 15B, the semiconductor chip package may further include a dielectric layer 604 on a side of the conductive layer 600 remote from the die 004, the dielectric layer 604 covering at least part of the conductive layer.

In addition, FIGS. 15C and 15D are semiconductor chip packages formed corresponding to the case whereby the connection portion is not formed on the back surface of the wafer during the fabrication of the panel assembly, and the details are not described herein again.

It should be noted that, for materials, structures or technical effects, etc. not mentioned in the description of the semiconductor chip package, reference may be made to the embodiments of the above semiconductor device packaging methods, panel assemblies, and wafer packages, and the details are not described herein again.

The above describes only exemplary embodiments of the present invention, and is not intended to limit the scope of the present invention. The scope of the present invention is defined by the appended claims.

What is claimed is:

1. A method for packaging a semiconductor device comprising:
   providing at least one wafer having a plurality of unsingulated semiconductor dies, wherein the at least one wafer comprises a first surface and a second surface opposite to each other and a side surface connecting the first surface and the second surface, the first surface being an active surface;
   forming a connection portion on the side surface of the at least one wafer surrounding the wafer, forming a panel assembly with the wafer and the connection portion, the connection portion comprising a third surface on the same side of the first surface of the wafer and a fourth surface on the same side as the second surface of the wafer, the third surface and the first surface forming a to-be-processed surface of the panel assembly;
   forming a first dielectric layer on the first surface of the wafer, wherein the first dielectric layer covers the first surface of the wafer entirely, and
   forming vias in the first dielectric layer to expose die pads on the first surface of the wafer.

2. The method in claim 1, comprising forming the first dielectric layer on the first surface of the wafer before forming the connection portion, wherein the third surface of the connection portion is substantially coplanar with a surface of the first dielectric layer remote from the first surface of the wafer.

3. The method in claim 1, comprising forming the first dielectric layer on the to-be-processed surface of the panel assembly after forming the connection portion.

4. The method in claim 1, further comprising: after forming the vias in the first dielectric layer on the first surface of the wafer, forming a conductive layer on the to-be-processed surface of the panel assembly to at least cover the first surface of the wafer.

5. The method in claim 4, wherein forming the conductive layer on the to-be-processed surface of the panel assembly to cover at least the first surface of the wafer comprises: forming an active conductive layer on the first surface of the wafer and forming a dummy conductive layer on the third surface of the connection portion.

6. The method in claim 5, wherein the dummy conductive layer is formed at least in an annular area surrounding the wafer, and the annular area has a width greater than 5 mm.

7. The method in claim 4, further comprising:
   forming a second dielectric layer on a side of the conductive layer remote from the panel assembly to cover at least part of the conductive layer.

8. The method in claim 1, comprising providing a plurality of wafers, the plurality of wafers being separated from each other in the panel assembly.

9. The method in claim 1, wherein forming the connection portion comprises:
   disposing the wafer on a carrier, the first surface of the wafer facing the carrier;
   forming an encapsulation layer over the carrier and the wafer, so that the encapsulation layer covers the side surface and the second surface of the wafer; and
   separating the carrier to expose the to-be-processed surface of the panel assembly.

10. The method in claim 1, wherein forming the connection portion comprises:
    disposing the wafer on a carrier, the second surface of the wafer facing the carrier, disposing a cavity mold with a through opening on the carrier, so that the wafer is positioned within the opening, forming a fixing material in a gap between a sidewall of the opening and the side surface of the wafer to connect the wafer to the cavity mold.

11. The method in claim 10, wherein the cavity mold has a material comprising a conductive material.

12. The method in claim 10, wherein the opening has a shape substantially the same as the wafer, and has a larger diameter larger than the wafer.

13. The method in claim 1, wherein forming the connection portion comprises:
    disposing the wafer on a carrier, the first surface facing the carrier, disposing a cavity mold having a through opening on the carrier, so that the wafer is positioned within the opening, forming a fixing material in a gap between a sidewall of the opening and the side surface of the wafer to connect the wafer to the cavity mold; and
    separating the carrier to expose the to-be-processed surface of the panel assembly.

14. A method for packaging a semiconductor device, comprising:
    providing at least one wafer having a plurality of unsingulated semiconductor dies, wherein the at least one wafer comprises a first surface and a second surface opposite to each other and a side surface connecting the first surface and the second surface, the first surface being an active surface;
    forming a connection portion on the side surface of the at least one wafer surrounding the wafer, forming a panel assembly with the wafer and the connection portion, the connection portion comprising a third surface on the same side of the first surface of the wafer and a fourth surface on the same side as the second surface of the wafer, the third surface and the first surface forming a to-be-processed surface of the panel assembly; and
    forming a first dielectric layer on the first surface of the wafer, wherein the first dielectric layer covers the first surface of the wafer entirely,
    wherein forming the connection portion comprises forming a conductive member, the conductive member being exposed in the third surface of the connection portion, located in a peripheral area of the panel assembly and spaced apart from the wafer.

15. The method in claim 14, further comprising removing a portion of the first dielectric layer for exposing the conductive member from the first dielectric layer.

16. The method in claim 15, further comprising performing an electroplating process for forming a conductive layer on the to-be-processed surface of the panel assembly to at least cover the first surface of the wafer, wherein the conductive member is used for an electrical contact of the electroplating process.

17. The method in claim 16, further comprising forming a seed layer on the to-be-processed surface of the panel assembly before the electroplating process, wherein the seed layer is in electrical contact with the conductive member.

18. The method in claim 16, wherein forming the conductive layer on the to-be-processed surface of the panel assembly to cover at least the first surface of the wafer comprises: forming an active conductive layer on the first surface of the wafer and forming a dummy conductive layer on the third surface of the connection portion.

19. The method in claim 18, wherein the dummy conductive layer is formed at least in an annular area surrounding the wafer, and the annular area has a width greater than 5 mm.

20. The method in claim 14, wherein the conductive member comprises a first conductive member located in a first portion of the peripheral area and a second conductive member located in a second portion of the peripheral area opposed to the first portion of the peripheral area.

* * * * *